(12) United States Patent
Huang et al.

(10) Patent No.: US 11,531,377 B2
(45) Date of Patent: Dec. 20, 2022

(54) FOLDABLE DISPLAY APPARATUS

(71) Applicant: HUAWEI TECHNOLOGIES CO., LTD., Guangdong (CN)

(72) Inventors: Bo Huang, Shanghai (CN); Xiaolong Li, Shanghai (CN); Weihua Mao, Shanghai (CN); Hui Zhang, Shanghai (CN); Bo Wu, Shanghai (CN); Peng Zha, Shanghai (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 17/058,917

(22) PCT Filed: May 28, 2018

(86) PCT No.: PCT/CN2018/088760
§ 371 (c)(1),
(2) Date: Nov. 25, 2020

(87) PCT Pub. No.: WO2019/227296
PCT Pub. Date: Dec. 5, 2019

(65) Prior Publication Data
US 2021/0216104 A1    Jul. 15, 2021

(51) Int. Cl.
*G06F 1/16* (2006.01)
*H01L 51/52* (2006.01)
(Continued)

(52) U.S. Cl.
CPC .......... *G06F 1/1652* (2013.01); *G06F 1/1616* (2013.01); *G06F 1/1641* (2013.01);
(Continued)

(58) Field of Classification Search
CPC .... G06F 1/1652; G06F 1/1641; G06F 1/1616; G06F 1/1681; G06F 1/1686;
(Continued)

(56) References Cited

U.S. PATENT DOCUMENTS 6,643,124 B1    11/2003   Wilk
9,179,559 B1 *  11/2015   Kim .................... H04M 1/0268
(Continued)

FOREIGN PATENT DOCUMENTS

CN    204374828 U    6/2015
CN    104821138 A    8/2015
(Continued)

OTHER PUBLICATIONS

English translation of CN107195253A (Year: 2017).*

*Primary Examiner* — Abhishek M Rathod
(74) *Attorney, Agent, or Firm* — Womble Bond Dickinson (US) LLP

(57) ABSTRACT

This application discloses a foldable display apparatus, including a flexible display screen and a bearer component, where the bearer component includes a first plane part, a first bending part, a second plane part, a second bending part, and a third plane part that are sequentially connected in a long side direction, a length of the first bending part in the long side direction is greater than a length of the second bending part in the long side direction, the plurality of parts jointly bear the flexible display screen, the third plane part is folded between the first plane part and the second plane part through bending and deformation of the first bending part and the second bending part, and parts, of the flexible display screen, borne by the first plane part and the second plane part are exposed.

20 Claims, 14 Drawing Sheets

(51) Int. Cl.
*H04B 1/3827* (2015.01)
*H04M 1/02* (2006.01)

(52) U.S. Cl.
CPC ........ *G06F 1/1686* (2013.01); *H01L 51/5237* (2013.01); *H01L 2251/5338* (2013.01); *H04B 1/3827* (2013.01); *H04M 1/0268* (2013.01)

(58) Field of Classification Search
CPC ......... G06F 2203/04803; G06F 1/1675; G06F 1/1679; G06F 3/04883; H01L 51/5237; H01L 2251/5338; H04B 1/3827; H04M 1/0268; H04M 2250/16; H04M 2250/22; H04M 2250/52; H04M 1/0214; H04M 1/0247; G09F 9/30
See application file for complete search history.

(56) References Cited

U.S. PATENT DOCUMENTS

| | | | |
|---|---|---|---|
| D761,251 S * | 7/2016 | Senda | D14/341 |
| D761,252 S * | 7/2016 | Senda | D14/341 |
| D761,253 S * | 7/2016 | Yamazaki | D14/341 |
| 9,697,941 B2 * | 7/2017 | Lee | G02F 1/13 |
| D812,605 S | 3/2018 | Senda | |
| D822,633 S * | 7/2018 | Yeom | D14/138 AB |
| 10,303,218 B2 * | 5/2019 | Jones | G06F 1/1618 |
| 10,331,176 B2 * | 6/2019 | Kim | G06F 1/1652 |
| 10,429,894 B2 * | 10/2019 | Xia | G06F 1/1649 |
| 10,678,428 B2 * | 6/2020 | Kim | G06F 3/0487 |
| 2006/0142053 A1 * | 6/2006 | Garcia | H04N 5/2254 455/556.1 |
| 2011/0241998 A1 | 10/2011 | Mckinney et al. | |
| 2012/0307423 A1 * | 12/2012 | Bohn | G06F 1/1652 361/679.01 |
| 2012/0314399 A1 * | 12/2012 | Bohn | G06F 1/1652 362/97.1 |
| 2012/0314400 A1 * | 12/2012 | Bohn | G06F 1/1652 362/97.1 |
| 2013/0222998 A1 * | 8/2013 | Cho | G06F 1/1652 361/679.27 |
| 2014/0285476 A1 | 9/2014 | Cho et al. | |
| 2015/0227224 A1 * | 8/2015 | Park | G06F 1/1677 345/173 |
| 2016/0070304 A1 * | 3/2016 | Shin | G06F 1/1652 361/679.26 |
| 2016/0116944 A1 * | 4/2016 | Lee | G06F 1/1652 361/679.26 |
| 2016/0147362 A1 * | 5/2016 | Eim | G06F 3/0416 345/173 |
| 2016/0198100 A1 * | 7/2016 | Cho | H04L 51/10 348/222.1 |
| 2016/0212840 A1 * | 7/2016 | Koo | G09G 3/035 |
| 2016/0274718 A1 * | 9/2016 | Burr | G06F 1/1694 |
| 2017/0013729 A1 | 1/2017 | Rothkopf et al. | |
| 2017/0075388 A1 * | 3/2017 | Yee | G06F 1/1643 |
| 2017/0199549 A1 * | 7/2017 | Yeom | G06F 1/1652 |
| 2017/0199712 A1 * | 7/2017 | Lee | G01B 7/22 |
| 2017/0287385 A1 * | 10/2017 | Lian | H04M 1/0216 |
| 2018/0004252 A1 | 1/2018 | Ahrens et al. | |
| 2018/0007252 A1 * | 1/2018 | Tuulos | H04M 1/0235 |
| 2018/0046220 A1 | 2/2018 | Kim et al. | |
| 2018/0255219 A1 * | 9/2018 | Ramaprakash | G02B 26/007 |
| 2019/0371505 A1 * | 12/2019 | Lin | H01F 7/129 |

FOREIGN PATENT DOCUMENTS

| | | |
|---|---|---|
| CN | 105259984 A | 1/2016 |
| CN | 105493169 A | 4/2016 |
| CN | 105676958 A | 6/2016 |
| CN | 105788458 A | 7/2016 |
| CN | 105810104 A | 7/2016 |
| CN | 205454263 U | 8/2016 |
| CN | 106131251 A | 11/2016 |
| CN | 106155325 A | 11/2016 |
| CN | 106328007 A | 1/2017 |
| CN | 106373490 A | 2/2017 |
| CN | 106603773 A | 4/2017 |
| CN | 106935147 A | 7/2017 |
| CN | 107195253 A | 9/2017 |
| EP | 3023856 A1 | 5/2016 |
| JP | 2016018198 A | 2/2016 |
| WO | 0153919 A2 | 7/2001 |

\* cited by examiner

FOLDABLE DISPLAY APPARATUS

CROSS-REFERENCE TO RELATED APPLICATIONS

This application is a National Stage of International Application No. PCT/CN2018/088760, filed on May 28, 2018, which is hereby incorporated by reference in its entirety.

TECHNICAL FIELD

This application relates to the field of display technologies, and in particular, to a foldable display apparatus.

BACKGROUND

Currently, for an electronic device with a display screen, for example, a display electronic product such as a mobile phone or a tablet computer, a size of the display screen usually matches a hardware size. If the display screen needs to have a larger display area, hardware also needs to be enlarged accordingly, which greatly reduces portability of the product.

SUMMARY

This application provides a foldable display apparatus. In this application, the foldable display apparatus may be understood as an apparatus whose display area can be folded. The foldable display apparatus may be an electronic product having a display function, such as a mobile phone, a tablet computer, or a wearable device, which can implement large-screen display and is convenient to carry.

In some embodiments, the foldable display apparatus includes a flexible display screen and a bearer component. The bearer component has an unfolded form and a folded form. There may be a plurality of shapes when the bearer component is unfolded, for example, a rectangle, a circle, and a hexagon. When the bearer component is unfolded, there are a long side direction and a short side direction, and the short side direction and the long side direction are perpendicular to each other. A mobile phone is used as an example, and the bearer component may be roughly rectangular when the bearer component is unfolded. A direction in which a long side of the bearer component is located is a long side direction, and a direction in which a short side of the bearer component is located is a short side direction.

The bearer component includes a first plane part, a first bending part, a second plane part, a second bending part, and a third plane part that are sequentially connected in the long side direction. A length of the first bending part in the long side direction is greater than a length of the second bending part in the long side direction. Lengths of the first plane part, the second plane part, and the third plane part in the long side direction may be the same or different. Lengths of parts of the bearer component in the short side direction are consistent. When the bearer component changes a form, the first plane part, the second plane part, and the third plane part maintain a plane state, the first bending part changes between a curved surface and a plane, and the second bending part changes between a curved surface and a plane.

The first plane part, the first bending part, the second plane part, the second bending part, and the third plane part jointly bear the flexible display screen. In other words, when the bearer component is unfolded, the flexible display screen is attached to a surface of the bearer component. When the first bending part and the second bending part are bent and deformed, the third plane part is folded between the first plane part and the second plane part. In addition, parts, of the flexible display screen, borne by the first plane part and the second plane part are exposed.

In this implementation, when the bearer component is unfolded, the first plane part, the first bending part, the second plane part, the second bending part, and the third plane part are coplanar, and the entire flexible display screen is unfolded and can be used for display. Therefore, the foldable display apparatus can implement large-screen display, and a display area is relatively large. When the bearer component is folded, the bearer component can fold the third plane part between the first plane part and the second plane part through bending and deformation of the first bending part and the second bending part. In this way, a length of the bearer component is only about one third of a length of the bearer component when the bearer component is unfolded, and the foldable display apparatus is convenient to carry. Therefore, the foldable display apparatus can implement large-screen display and is convenient to carry.

In addition, when the bearer component is folded, the parts, of the flexible display screen, borne by the first plane part and the second plane part are exposed. Therefore, about two thirds of the flexible display screen may be used for display. In this way, a display area of the foldable display apparatus in a folded state is still relatively large, so that viewing experience of a user can also be satisfied in the folded state. The foldable display apparatus may display an image on a part, of the flexible display screen, borne by the first plane part, or display an image on a part, of the flexible display screen, borne by the second plane part, or display images on the parts, of the flexible display, borne by the first plane part and the second plane part at the same time, so that the foldable display apparatus has various display manners, to improve user experience.

It may be understood that, because the length of the first bending part in the long side direction is greater than the length of the second bending part in the long side direction, when the first bending part and the second bending part are bent and deformed, the third plane part connected to the second bending part can be folded between the second plane part and the first plane part connected to the first bending part.

When the bearer component is folded, with bending and deformation of the first bending part and the second bending part, the parts, of the flexible display screen, borne by the first plane part and the second plane part are exposed, and parts, of the flexible display screen, borne by the first bending part and the second bending part are also exposed, to further increase a display area of the foldable display apparatus. Therefore, a display manner of the foldable display apparatus is more diversified.

In this application, the foldable display apparatus further includes a first housing. The foldable display apparatus further includes a plurality of components. The plurality of components include a battery, an antenna, a camera, an electronic control board, a speaker, an earpiece, a sensor (such as a photosensor and an infrared sensor), and the like. The plurality of components are accommodated in the first housing. There are a plurality of connection relationships between the first housing and the bearer component.

In an implementation, the first housing is fastened to a side, of the second plane part, away from the flexible display screen. When the bearer component is folded, the first housing is located between the third plane part and the second plane part. In a process in which the bearer component changes from the unfolded state to the folded state, the second bending part is bent first, so that the third plane part moves to a side, of the first housing, away from the second plane part. Then, the first bending part is bent, so that the first plane part is located on a side, of the third plane part, away from the first housing.

In this implementation, because the plurality of components of the foldable display apparatus are all disposed in the first housing, and the first housing is fastened to the side, of the second plane part, away from the flexible display screen, when the bearer component is folded, the first housing is located between the third plane part and the second plane part. The foldable display apparatus does not need to reserve a thickness between the first plane part and the third plane part for arrangement of another device, and the first plane part and the third plane part may be compactly arranged. This reduces an overall thickness of the foldable display apparatus during folding, and improves portability of the foldable display apparatus.

In an implementation, the first housing is fastened to a side, of the first plane part, away from the flexible display screen. When the bearer component is folded, the first housing is located between the third plane part and the first plane part. In a process in which the bearer component changes from the unfolded state to the folded state, the second bending part is bent first, so that the third plane part moves close to a bottom side of the second plane part. Then, the first bending part is bent, so that the third plane part and the second plane part move, at the same time, close to a side, of the first housing, away from the first plane part, and the third plane part is located between the first housing and the second plane part.

In this implementation, because the plurality of components of the foldable display apparatus are all disposed in the first housing, and the first housing is fastened to the side, of the first plane part, away from the flexible display screen, when the bearer component is folded, the first housing is located between the third plane part and the first plane part. The foldable display apparatus does not need to reserve a thickness between the second plane part and the third plane part for arrangement of another device, and the second plane part and the third plane part may be compactly arranged. This reduces an overall thickness of the foldable display apparatus during folding, and improves portability of the foldable display apparatus.

In an implementation, the first housing is fastened to a side, of the third plane part, away from the flexible display screen. When the bearer component is folded, the first housing is located between the third plane part and the second plane part. In a process in which the bearer component changes from the unfolded state to the folded state, the second bending part is bent first, so that the second plane part and the first plane part move, at the same time, close to a side, of the first housing, away from the third plane part. Then, the first bending part is bent, so that the first plane part moves to a side, of the third plane part, away from the first housing.

In this implementation, because the plurality of components of the foldable display apparatus are all disposed in the first housing, and the first housing is fastened to the side, of the third plane part, away from the flexible display screen, when the bearer component is folded, the first housing is located between the third plane part and the first plane part. The foldable display apparatus does not need to reserve a thickness between the second plane part and the third plane part for arrangement of another device, and the second plane part and the third plane part may be compactly arranged. This reduces an overall thickness of the foldable display apparatus during folding, and improves portability of the foldable display apparatus.

In this application, the foldable display apparatus may alternatively include a first housing and a second housing. A thickness of the first housing is different from a thickness of the second housing. The first housing and the second housing are fastened to two plane parts (the first plane part, the second plane part, and the third plane part) of the bearer component. A size of the first housing in a vertical direction of a plane part to which the first housing is fastened is the thickness of the first housing. A size of the second housing in a vertical direction of a plane part to which the second housing is fastened is the thickness of the second housing.

The plurality of components of the foldable display apparatus may be arranged in the first housing and the second housing based on a requirement. For example, the thickness of the first housing is less than the thickness of the second housing. A device with a relatively small thickness may be placed in the first housing, and a device with a relatively large thickness may be placed in the second housing, to improve space utilization of the first housing and the second housing, and further reduce a thickness of an overall thickness of the foldable display apparatus in the folded state. In another implementation, the thickness of the first housing may alternatively be greater than the thickness of the second housing.

There are a plurality of connection relationships between the first housing, the second housing, and the bearer component.

In an implementation, the first housing is fastened to a side, of the first plane part, away from the flexible display screen. The second housing is fastened to a side, of the second plane part, away from the flexible display screen. When the bearer component is folded, the third plane part is located between the first housing and the second housing. In a process in which the bearer component changes from the unfolded state to the folded state, the second bending part is bent first, so that the third plane part moves to a side, of the second housing, away from the second plane part. Then, the first bending part is bent, so that the first plane part is located on a side, of the third plane part, away from the first housing.

In an implementation, the first housing is fastened to a side, of the second plane part, away from the flexible display screen. The second housing is fastened to a side, of the third plane part, away from the flexible display screen. When the bearer component is folded, the first housing and the second housing are located between the second plane part and the third plane part. In a process in which the bearer component changes from the unfolded state to the folded state, the second bending part is bent first, so that the third plane part and the second housing move, at the same time, close to a side, of the first housing, away from the second plane part. Then, the first bending part is bent, so that the first plane part moves close to a side, of the third plane part, away from the second housing.

In an implementation, the first housing is fastened to a side, of the first plane part, away from the flexible display screen. The second housing is fastened to a side, of the third plane part, away from the flexible display screen. When the bearer component is folded, the first housing is located between the first plane part and the third plane part, and the second housing is located between the second plane part and the third plane part. In a process in which the bearer component changes from the unfolded state to the folded state, the second bending part is bent first, so that the third plane part and the second housing move, at the same time, close to a side, of the second plane part, away from the flexible display screen. Then, the first bending part is bent, so that the first plane part and the first housing move, at the same time, close to a side, of the third plane part, away from the second housing.

In this application, the foldable display apparatus may alternatively include a first housing, a second housing, and a third housing. A thickness relationship among the first housing, the second housing, and the third housing is not limited in this application. The first housing is fastened to a side, of the first plane part, away from the flexible display screen, the second housing is fastened to a side, of the second plane part, away from the flexible display screen, and the third housing is fastened to a side, of the third plane part, away from the flexible display screen.

In this application, the first bending part and the second bending part that are of the bearer component have a folded state, an unfolded state, and a plurality of unfolded states at different angles. The first bending part and the second bending part have a plurality of implementations. The following is an example.

In an implementation, the bearer component is an integrated bearing plate. The bearing plate includes a shape-memory metal material. The bearing plate may further include another material (for example, a metal material), used to increase rigidity of the bearing plate, so that the bearing plate has a deformation capability, and can provide sufficient support for the flexible display screen.

The shape-memory metal is also referred to as a shape memory alloy, and is an alloy material that can completely eliminate deformation of the shape-memory metal at a relatively low temperature and restore an original shape of the shape-memory metal after the shape-memory metal is heated and heated up, in other words, the alloy with a "memory" effect. In the foldable display apparatus, a voltage is applied to two ends of the bearing plate, so that a current flows through the bearing plate, so that the bearing plate heats up, and is restored to an original shape.

The initial shape of the bearing plate corresponds to the unfolded state of the bearer component, the bearer component may change from the unfolded state to the folded state under external force, and when the bearing plate is powered on, the bearer component is restored from the folded state to the unfolded state. Alternatively, the initial shape of the bearing plate corresponds to the folded state of the bearer component, the bearer component may change from the folded state to the unfolded state under external force, and when the bearing plate is powered on, the bearer component is restored from the unfolded state to the folded state. It may be understood that, when the bearing plate is not powered on, the bearer component may also be restored to an initial state under external force.

A reinforcing plate may be disposed in an area, of the bearing plate, corresponding to the first plane part, a reinforcing plate may be disposed in an area, of the bearing plate, corresponding to the second plane part, and a reinforcing plate may be disposed in an area, of the bearing plate, corresponding to the third plane part. The reinforcing plate and the bearing plate are disposed in a stacked manner, and the reinforcing plate is used to increase rigidity of the first plane part, the second plane part, and the third plane part.

In an implementation, the first plane part, the second plane part, and the third plane part are rigid plates. The first bending part and the second bending part are shape-memory plates. The shape-memory plate includes a shape-memory metal material. The shape-memory plate may further include another material (for example, a metal material), used to increase rigidity of the shape-memory plate, so that the shape-memory plate has a deformation capability, and can provide sufficient support for the flexible display screen.

In this implementation, the flexible display screen is supported by the rigid plate and the shape-memory plate. The initial shape of the shape-memory plate corresponds to the unfolded state of the bearer component, the bearer component may change from the unfolded state to the folded state under external force, and when the shape-memory plate is powered on, the bearer component is restored from the folded state to the unfolded state. Alternatively, the initial shape of the shape-memory plate corresponds to the folded state of the bearer component, the bearer component may change from the folded state to the unfolded state under external force, and when the shape-memory plate is powered on, the bearer component is restored from the unfolded state to the folded state. It may be understood that, when the shape-memory plate is not powered on, the bearer component may also be restored to an initial state under external force.

In an implementation, the first plane part, the second plane part, and the third plane part are rigid plates. The first bending part and the second bending part include a deformable plate and a bending piece. The deformable plate and the bending piece are disposed in a stacked manner. The deformable plate includes a shape-memory metal material. The deformable plate may further include another material (for example, a metal material), used to increase rigidity of the deformable plate, so that the deformable plate has a deformation capability, and can support the flexible display screen. The bending piece is bent or unfolded under external force. The bending piece may have a plurality of structures such as an elastic plate structure, a chain structure, a meshing gear group structure, and a rotating shaft connection structure.

In this implementation, the bending piece may play a main supporting role for the flexible display screen, and the deformable plate plays an auxiliary supporting role for the flexible display screen. An initial shape of the deformable plate corresponds to the unfolded state of the bearer component, and the bearer component may change from the unfolded state to the folded state under external force. When the deformable plate is powered on, the deformable plate drives the bending piece to be unfolded, and the bearer component is restored from the folded state to the unfolded state. Alternatively, an initial shape of the deformable plate corresponds to the folded state of the bearer component, and the bearer component may change from the folded state to the unfolded state under external force. When the deformable plate is powered on, the deformable plate drives the bending piece to be bent, and the bearer component is restored from the unfolded state to the folded state. It may be understood that, when the deformable plate is not powered on, the bearer component may also be restored to an initial state under external force.

In this application, a position-limiting structure is disposed on the foldable display apparatus, and the position-limiting structure is configured to enable the foldable display apparatus to maintain a stable folded state, an unfolded state, and a plurality of unfolded states at different angles.

In this application, an example in which the position-limiting structure enables the foldable display apparatus to maintain the stable folded state is used for description. For example, the foldable display apparatus further includes a first position-limiting component and a second position-limiting component. Two parts of the first position-limiting component are respectively fastened to the first plane part and the second plane part. Two parts of the second position-limiting component are respectively fastened to the second plane part and the third plane part. When the bearer component is folded, the two parts of the first position-limiting component cooperate with each other to fasten the first plane part and the second plane part. The two parts of the second position-limiting component cooperate with each other to fasten the second plane part and the third plane part.

In an implementation, the first position-limiting component includes two mutually adsorbed adsorption components. The second position-limiting component includes two mutually adsorbed adsorption components. The two mutually adsorbed adsorption components may be two magnets with different magnetism, or one of the two adsorption components is a magnet, and the other adsorption component is made of a material (namely, a ferromagnetic material, for example, iron, nickel, or cobalt) that may be magnetically adsorbed.

In another implementation, the first position-limiting component includes two fasteners that can be fastened to each other. The second position-limiting component includes two fasteners that can be fastened to each other.

In this application, only after a position-limiting lock state of the bearer component is released, the shape-memory metal can be powered on to heat up to restore the shape-memory metal to an initial state, to assist in unfolding or folding the bearer component.

In an implementation, the bearer component further includes a first arc surface part and a second arc surface part. The first arc surface part is connected to a side, of the first plane part, away from the first bending part. The first arc surface part moves with the first plane part. The second arc surface part is connected to a side, of the third plane part, away from the second bending part. The second arc surface part moves with the second plane part. The first arc surface part and the second arc surface part are also used to bear the flexible display screen.

In this implementation, disposing of the first arc surface part and the second arc surface part increases an area that is of the bearer component and that can be used to bear the flexible display screen, to increase a display area of the flexible display screen, and a display area of the foldable display apparatus is larger. In addition, the first arc surface part and the second arc surface part are disposed, so that the foldable display apparatus has a 2.5D display effect in the unfolded state, and visual experience of a user can be improved.

In an implementation, the flexible display screen includes a first plane display area, a first bending display area, a second plane display area, a second bending display area, and a third plane display area. The first plane display area overlaps the first plane part. The first plane display area moves with the first plane part. The first bending display area overlaps the first bending part. The first bending display area moves with the first bending part. The second plane display area overlaps the second plane part. The second plane display area moves with the second plane part. The second bending display area overlaps the second bending part. The second bending display area moves with the second bending part. The third plane display area overlaps the third plane part. The third plane display area moves with the third plane part.

In an implementation, the flexible display screen is a touch display screen. When displaying an image, the flexible display screen can sense a touch action of the user, to interact with the user.

In an implementation, the flexible display is an organic light emitting diode display screen.

The foldable display apparatus further includes a controller. The controller is electrically connected to the flexible display. The controller is configured to light up or turn off at least one of the first plane display area, the first bending display area, the second plane display area, the second bending display area, and the third plane display area.

When the foldable display apparatus is in the unfolded state, the controller may light up or turn off the entire flexible display screen at the same time. The controller may further exchange information with the flexible display screen, so that the flexible display screen displays an image. When the flexible display screen has a touch function, the controller may further receive a touch signal of the flexible display screen.

When the foldable display apparatus is in the folded state, the first plane display area and the second plane display area are respectively located on a front side and a rear side of the foldable display apparatus. The controller may light up at least one of the first plane display area or the second plane display area, and other areas of the flexible display screen remain an off state, to meet a viewing requirement of the user, and reduce energy consumption of the foldable display apparatus.

In an implementation, the controller includes a receiving unit and a driver unit.

The receiving unit is configured to receive a folding instruction. When detecting a first operation of a user, the flexible display screen sends the folding instruction to the receiving unit. The first operation corresponds to an operation of changing the bearer component to a folded state, for example, a touch action such as a tap, a double tap, a touch and hold, or a slide.

The driver unit is configured to: when the receiving unit receives the folding instruction, drive the bearer component to change to the folded state, and the third plane part is folded between the first plane part and the second plane part. In addition, parts, of the flexible display screen, borne by the first plane part and the second plane part are exposed.

The receiving unit is further configured to receive an unfolding instruction. When detecting a second operation of the user, the flexible display screen sends the unfolding instruction to the receiving unit. The second operation corresponds to an operation of changing the bearer component to an unfolded state, for example, a touch action such as a tap, a double tap, a touch and hold, or a slide.

The driver unit is further configured to: when the receiving unit receives the unfolding instruction, drive the bearer component to change to the unfolded state, and the first plane part, the second plane part, and the third plane part are unfolded to a same plane with each other. In this case, the flexible display screen is unfolded, so that large-screen display can be implemented.

In this application, when the foldable display apparatus is in the folded state, the foldable display apparatus may further implement a plurality of interaction functions with the user through the controller and another component. The following is an example.

In an implementation, the foldable display apparatus further includes a recognition component. The recognition component includes one or more of the camera and the sensor. The recognition component is fastened to the first housing. The first housing is fastened to the first plane part or the second plane part. In this application, an example in which the first housing is fastened to the second plane part is used for description. The recognition component and a part of the display area (namely, the second plane display area), of the flexible display screen, borne by the second plane part face a same direction.

The controller includes a receiving unit, a determining unit, and a lighting unit.

The receiving unit is configured to receive recognition information of the recognition component. When detecting a wake-up action of the user, the flexible display screen drives the recognition component to recognize, and sends recognition information to the receiving unit.

The determining unit is configured to determine, based on the recognition information, whether the recognition component faces the user or is away from the user.

The lighting unit is configured to: when the recognition component faces the user, light up the part of the display area (namely, the second plane display area), of the flexible display screen, borne by the second plane part. The lighting unit is further configured to: when the recognition component is away from the user, light up a part of the display area (namely, the first plane display area), of the flexible display screen, borne by the first plane part. The part of the display area that is of the flexible display screen and that is lit up displays screen content.

The recognition component may be the camera. The camera can collect an image. The recognition information is a shot image collected by the camera. The shot image is compared with an image prestored in a memory, to determine whether the recognition component faces the user or is away from the user. For example, the prestored image is a user facial image (or another recognition image such as a pupil image). When the shot image collected by the camera is the same as the prestored image, it is determined that the recognition component faces the user. When detecting that the distance between the foldable display apparatus 100 and the user is greater than a threshold, the sensor 82 determines that the recognition component is away from the user.

The recognition component may also be the sensor. The sensor may detect a distance between the foldable display apparatus and the user. When detecting that the distance between the foldable display apparatus and the user is less than or equal to a threshold, the sensor determines that the recognition component faces the user. When detecting that the distance between the foldable display apparatus and the user is greater than a threshold, the sensor determines that the recognition component is away from the user. When the sensor cannot recognize the user, it is also determined that the recognition component is away from the user.

The camera and the sensor may determine the user by recognizing a face, a pupil, or another biometric feature of the user.

In this application, the foldable display apparatus may collect user position information through the recognition component, to determine a relative position relationship between the first plane part and the user and a relative position relationship between the second plane part and the user, and further light up the part of the display area (namely, the first plane display area or the second plane display area), of the flexible display screen, facing the user. This improves user experience of the foldable display apparatus.

In another implementation, for example, the recognition component is the sensor. When the foldable display apparatus includes the first housing and the second housing, and the first housing is fastened to the first plane part, and the second housing is fastened to the second plane part, the foldable display apparatus may be provided with the sensor in each of the first housing and the second housing, and the sensor is electrically connected to the controller. Through the controller and the sensor, the first plane display area is automatically lit up when the first plane display area is relatively close to the user, and the second plane display area is automatically lit up when the second plane display area is relatively close to the user. Certainly, in some implementations, the recognition component may include the camera and the sensor. The foldable display apparatus may determine, through dual recognition and determining, the lit-up part of the flexible display screen, to improve recognition accuracy. In some implementations, the recognition component may also include another component that can be used to recognize a user position.

In an implementation, the foldable display apparatus further includes a camera and a sensor. The camera may collect an image. The sensor may detect a distance between the foldable display apparatus and the user. The camera and the sensor are accommodated in the first housing. Collection surfaces of the camera and the sensor face the flexible display screen.

In this application, the first housing may be fastened to the first plane part or the second plane part. In this way, the camera and the sensor may correspond to the first plane display area or the second plane display area of the flexible display screen. When the foldable display apparatus is folded, the first plane display area and the second plane display area are respectively located on a front side and a rear side of the foldable display apparatus. Therefore, the foldable display apparatus may implement selfie shooting (also referred to as front-facing shooting) and mutual shooting (also referred to as rear-facing shooting) by using a same camera. Collection surfaces of the camera and the sensor face a same direction as a part, of the flexible display screen, relatively fastened to the camera and the sensor. For example, the camera and the sensor are fastened relative to the first plane part, a collection surface of the camera faces the first plane display area, and a collection surface of the sensor faces the first plane display area. When the first plane display area faces the user, the user may take a selfie by using the camera, and the first plane display area displays a shot picture. When the second plane display area faces the user, the user may perform mutual shooting by using the camera, and the second plane display area displays a shot picture.

The controller includes a receiving unit, an obtaining unit, a switching unit, and a driver unit.

The receiving unit is configured to receive a shooting instruction. For example, when detecting that the user starts the camera to perform a touch action of shooting, the flexible display screen sends the shooting instruction to the receiving unit.

The obtaining unit is configured to: when the receiving unit receives the shooting instruction, obtain a distance between the foldable display apparatus and the user through the sensor.

The switching unit is configured to switch a shooting mode of the camera to a self-shooting mode or the mutual shooting mode based on the distance. When the user distance is less than or equal to a preset value, it is determined that the camera faces the user, and the switching unit switches the shooting mode of the camera to the self-shooting mode. When the user distance is greater than the preset value, or when the sensor cannot recognize the user, it is determined that the camera is away from the user, and the switching unit switches the shooting mode of the camera to the mutual shooting mode.

The driver unit is configured to receive shooting mode information of the switching unit, and start the camera to shoot. In other words, when the camera faces the user, the driver unit drives the camera to shoot in the self-shooting mode. When the camera is away from the user, the driver unit drives the camera to shoot in the mutual shooting mode.

In this application, because the foldable display apparatus may automatically switch the shooting mode of the camera based on an environment in which the user uses the camera, different image processing algorithms are run in different shooting modes. For example, in the self-shooting mode, beautification may be implemented according to an algorithm, and in the mutual shooting mode long-range blurring and the like may be implemented through an algorithm. In this way, shooting quality of the foldable display apparatus is better, and user experience is improved.

In an implementation, the controller includes a first obtaining unit, a second obtaining unit, a comparison unit, and a driver unit. The first obtaining unit is configured to obtain a first contact area that is of the first plane display area and that is in contact with the user. The second obtaining unit is configured to obtain a second contact area that is of the second plane display area and that is in contact with the user. The comparison unit is configured to compare the first contact area with the second contact area. The driver unit is configured to light up the first plane display area when the first contact area is less than the second contact area, or further configured to light up the first plane display area when the second contact area is less than the first contact area.

For example, when the first contact area is less than the second contact area, the first plane display area faces the user, the second plane display area is away from the user, and the first plane display area is lit up. When the second contact area is less than the first contact area, the second plane display area faces the user, the first plane display area is away from the user, and the second plane display area is lit up. In this implementation, the foldable display apparatus may automatically light up, based on a holding gesture of the user, a plane display area facing the user, to improve user experience.

Further, the controller further includes a third obtaining unit, a determining unit, and a switching unit. The third obtaining unit is configured to: when the first plane display area is lit up, obtain a contact position at which the user touches the first plane display area. The determining unit is configured to determine whether the contact position is located on a left-side area or a right-side area. The switching unit is configured to: when the contact position is located on the left-side area, switch the first plane display area to a left-hand mode screen. The switching unit is further configured to: when the contact position is located on the right-side area, display a right-hand mode screen in the first plane display area.

In this implementation, the foldable display apparatus determines a use habit of the user based on a position at which the lit-up plane display area is touched by the user, to switch a screen to the left-hand mode screen or a right-hand mode screen corresponding to the use habit of the user, to improve user experience.

In this application, the foldable display apparatus further includes one or more processors, one or more memories, and an instruction that is stored in the one or more memories and that can be executed by the one or more processors.

The one or more processors execute the instruction to implement the following steps:

responding to detection of a first operation, where the first operation may be an operation of the user on the flexible display screen, and the first operation corresponds to an operation of changing the bearer component to a folded state, for example, a touch action such as a tap, a double tap, a touch and hold, or a slide; and driving the bearer component to change to a folded state, where the third plane part is folded between the first plane part and the second plane part, and parts, of the flexible display screen, borne by the first plane part and the second plane part are exposed.

In an implementation, the one or more processors execute the instruction to further implement the following steps:

responding to detecting a second operation, where the second operation may be an operation of the user on the flexible display screen, and the second operation corresponds to an operation of changing the bearer component to an unfolded state, for example, a touch action such as a tap, a double tap, a touch and hold, or a slide; and driving the bearer component to change to the unfolded state, where the first plane part, the second plane part, and the third plane part are unfolded to a same plane with each other. In this case, the flexible display screen is unfolded, so that large-screen display can be implemented.

In this implementation, the foldable display apparatus may automatically unfold or fold based on a requirement of the user, to improve user experience.

In an implementation, the foldable display apparatus further includes a recognition component. The recognition component and the part of the display area (namely, the second plane display area), of the flexible display screen, borne by the second plane part face a same direction. The one or more processors execute the instruction to implement the following steps:

responding to detection of a third operation, where the third operation may be an operation of waking up the flexible display screen by the user; and controlling, based on recognition information of the recognition component, the part of the display area (namely, the second plane display area), of the flexible display screen, borne by the second plane part and/or the part of the display area (namely, the first plane display area), of the flexible display screen, borne by the first plane part to be used for display.

The part of the display area (namely, the second plane display area), of the flexible display screen, borne by the second plane part may be controlled, based on the recognition information, to be used for independent display, and other display areas of the flexible display screen are in a screen-off state. In this case, the foldable display apparatus can meet a display requirement, and energy consumption is relatively low.

Alternatively, the part of the display area (namely, the first plane display area), of the flexible display screen, borne by the first plane part may be controlled, based on the recognition information, to be used for independent display, and other display areas of the flexible display screen are in a screen-off state. In this case, the foldable display apparatus can meet a display requirement, and energy consumption is relatively low.

Alternatively, the part of the display area (namely, the second plane display area), of the flexible display screen, borne by the second plane part and the part of the display area (namely, the first plane display area), of the flexible display screen, borne by the first plane part may be controlled to be used for display. The second plane display area and the first plane display area may display same content, or may display different content. When the second plane display area and the first plane display area are used to display different content, one may display a main control screen, and the other may display a secondary screen.

For example, after the one or more processors execute the instruction in response to detection of the third operation:

obtaining recognition information of the recognition component;

determining, based on the recognition information, whether the recognition component faces the user or is away from the user; and when the recognition component faces the user, controlling the part of the display area (namely, the second plane display area), of the flexible display screen, borne by the second plane part to be used for display; and when the recognition component is away from the user, controlling the part of the display area (namely, the first plane display area), of the flexible display screen, borne by the first plane part to be used for display.

The recognition component may be the camera. The recognition information is a shot image collected by the camera. The shot image is compared with an image prestored in a memory, to determine whether the recognition component faces the user or is away from the user. For example, the prestored image is a user facial image (or another recognition image such as a pupil image). When the shot image collected by the camera is the same as the prestored image, it is determined that the recognition component faces the user. When the shot image collected by the camera is different from the prestored image, it is determined that the recognition component is away from the user.

Alternatively, the recognition component may be the sensor. When detecting that the distance between the foldable display apparatus and the user is less than or equal to a threshold, the sensor determines that the recognition component faces the user. When detecting that the distance between the foldable display apparatus and the user is greater than a threshold, the sensor determines that the recognition component is away from the user. When the sensor cannot recognize the user, it is also determined that the recognition component is away from the user.

In another embodiment, the recognition component may also be a gravity sensor. When directions of the foldable display apparatus are different, the gravity sensor can perform recognition.

After the one or more processors execute the instruction in response to detection of the third operation:

determining, based on the recognition information of the recognition component, that a display area, of the flexible display screen, facing upward is the part of the display area borne by the second plane part (namely, the second plane display area) or the part of the display area borne by the first plane part for display (namely, the first plane display area); and controlling the display area, of the flexible display screen, facing upward to be used for display.

In this application, the foldable display apparatus may collect user position information through the recognition component, to determine a relative position relationship between the first plane part and the user, a relative position relationship between the second plane part and the user, and position information of the foldable display apparatus, and further control the part of the display area (namely, the first plane display area or the second plane display area), of the flexible display screen, facing the user to be used for display. This improves user experience of the foldable display apparatus.

In an implementation, the foldable display apparatus further includes a camera and a sensor. Collection surfaces of the camera and the sensor face the flexible display screen. For example, the camera and the sensor are fastened relative to the first plane part, a collection surface of the camera faces the first plane display area, and a collection surface of the sensor faces the first plane display area. In other words, collection surfaces of the camera and the sensor face a part, of the flexible display screen, relatively fastened to the camera and the sensor.

The one or more processors execute the instruction to implement the following steps:

responding to detecting a sixth operation, where the sixth operation may be an action that the user starts the camera to shoot;

obtaining a user distance detected by the sensor, where the user distance is a distance between the foldable display apparatus and the user;

determining, based on the user distance, whether the camera faces the user or is away from the user; and when the camera faces the user, driving the camera to shoot in a self-shooting mode; and when the camera is away from the user, driving the camera shoot in a mutual shooting mode.

When the user distance is less than or equal to a preset value, it is determined that the camera faces the user. When the user distance is greater that a preset value, it is determined that the camera is away from the user. When the sensor cannot recognize the user, it is also determined that the camera is away from the user.

In this application, because the foldable display apparatus may automatically switch the shooting mode of the camera based on an environment in which the user uses the camera, different image processing algorithms are run in different shooting modes. For example, in the self-shooting mode, beautification may be implemented according to an algorithm, and in the mutual shooting mode long-range blurring and the like may be implemented through an algorithm. In this way, shooting quality of the foldable display apparatus is better, and user experience is improved.

In an implementation, the one or more processors execute the instruction to further implement the following steps:

response to detection of a fourth operation, where the fourth operation may be an operation of waking up the flexible display screen by the user; and controlling, based on detection information of the flexible display screen, the part of the display area (namely, the second plane display area), of the flexible display screen, borne by the second plane part or the part of the display area (namely, the first plane display area), of the flexible display screen, borne by the first plane part to be used for display.

For example, after the one or more processors execute the instruction in response to detection of the fourth operation:

obtaining a first contact area detected by the flexible display screen, where the first contact area is a first contact area that is of the part of the display area (namely, the first plane display area), of the flexible display screen, borne by the first plane part and that is touched by the user;

obtaining a second contact area detected by the flexible display screen, where the second contact area is a second contact area that is of the part of the display area (namely, the second plane display area), of the flexible display screen, borne by the second plane part and that is touched by the user;

comparing the first contact area with the second contact area; and when the first contact area is less than the second contact area, controlling the part of the display area (namely, the first plane display area), of the flexible display screen, borne by the first plane part to be used for display; and when the second contact area is less than the first contact area, controlling the part of the display area (namely, the second plane display area), of the flexible display screen, borne by the second plane part to be used for display.

In this implementation, the foldable display apparatus may determine a holding gesture of the user based on the first contact area and the second contact area, and automatically light up the display area, of the flexible display screen, facing the user side, to improve user experience.

In an implementation, the one or more processors execute the instruction to further implement the following steps:

when the part of the display area (namely, the first plane display area), of the flexible display screen, borne by the first plane part is used for display, obtaining a contact position at which the user touches the part of the display area (namely, the first plane display area), of the flexible display screen, borne by the first plane part;

determining that the contact position is located in a left-side area or a right-side area; and when the contact position is located on the left-side area, driving the part of the display area (namely, the first plane display area), of the flexible display screen, borne by the first plane part to display a left-hand mode screen; and when the contact position is located on the right-side area, driving the part of the display area (namely, the first plane display area), of the flexible display screen, borne by the first plane part to display a right-hand mode screen.

In this implementation, the foldable display apparatus determines a use habit of the user based on a position at which the lit-up part of the flexible display screen is touched by the user, to switch a screen to the left-hand mode screen or the right-hand mode screen corresponding to the use habit of the user, to improve user experience.

BRIEF DESCRIPTION OF DRAWINGS

To describe the technical solutions in implementations of this application or in the background more clearly, the following briefly describes the accompanying drawings for describing the implementations of this application or the background.

DESCRIPTION OF EMBODIMENTS

The following describes implementations of this application with reference to the accompanying drawings in the implementations of this application.

Figure 1:
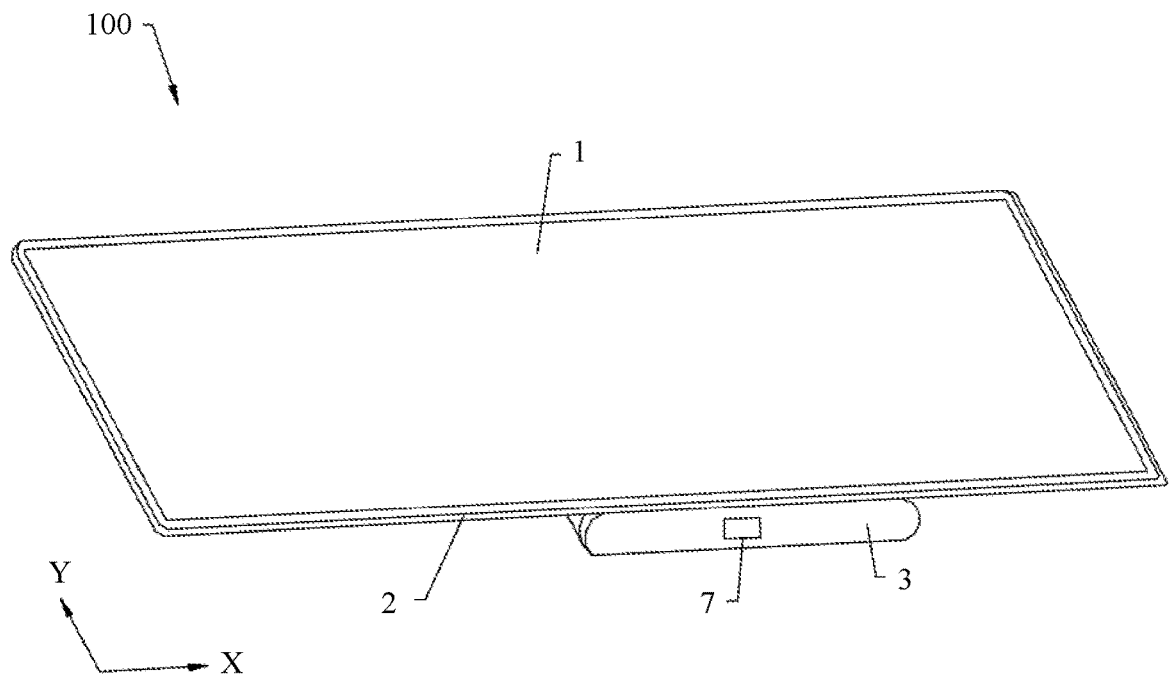
FIG. 1 is a schematic structural diagram of an optional foldable display apparatus according to an implementation of this application.

Referring to FIG. 1, this application provides a foldable display apparatus 100. The foldable display apparatus 100 is an apparatus whose display area can be folded. The foldable display apparatus 100 has an expanded form and a folded form. All forms obtained after the foldable display apparatus 100 cancels the folded form may be summarized into the expanded form, and an unfolded form is one of the expanded forms. This application is described through two forms: the unfolded form and the folded form.

A display area of the foldable display apparatus 100 has a plurality of sub display subareas. In this application, "a plurality of" means greater than or equal to two. The plurality of sub display areas of the foldable display apparatus 100 in the unfolded form are spliced into a large area display area, to implement large-screen display. The plurality of sub display areas of the foldable display apparatus 100 in the folded form overlap, some of the sub display areas are exposed for display, some of the sub display areas are hidden, and the folded foldable display apparatus 100 is easy to be storage and carried.

The foldable display apparatus 100 may be an electronic product having a display function, such as a mobile phone, a tablet computer, or a wearable device. In this application, an example in which the foldable display apparatus 100 is a mobile phone is used for description.

Figure 2:
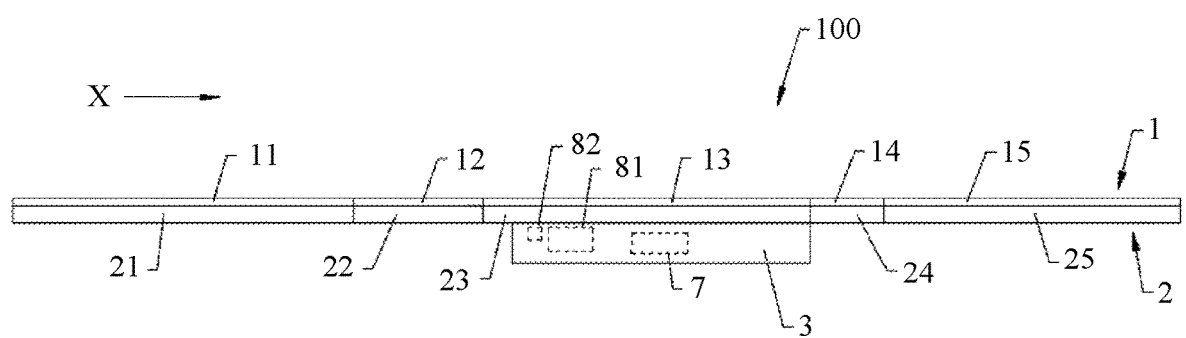
FIG. 2 is a schematic structural diagram when the foldable display apparatus shown in FIG. 1 is in an unfolded state.
Figure 3:
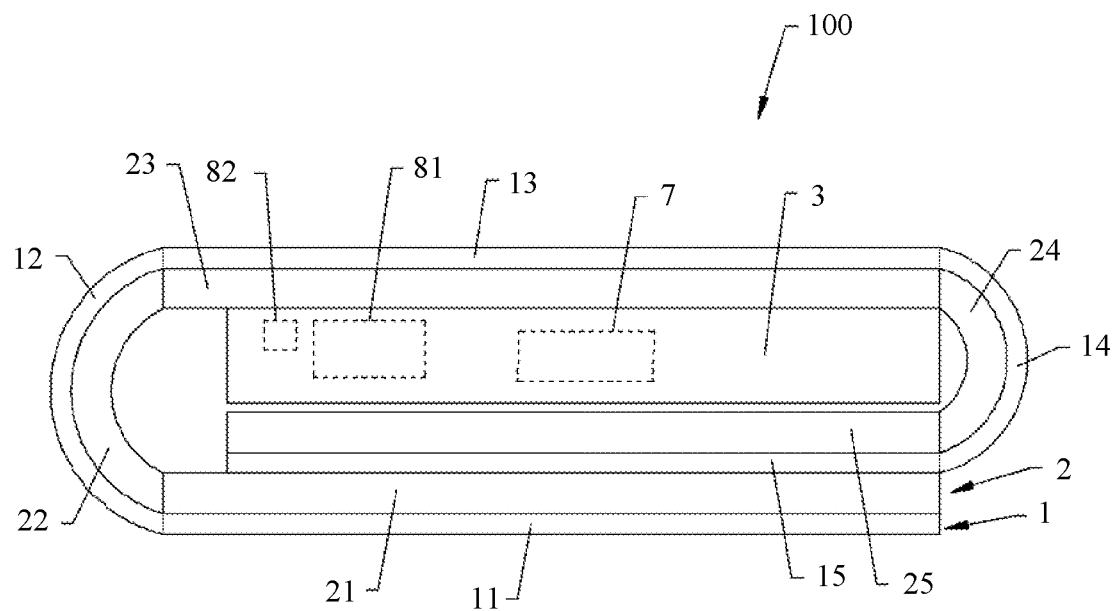
FIG. 3 is a schematic structural diagram when the foldable display apparatus shown in FIG. 1 is in a folded state.

Referring to FIG. 1 to FIG. 3, the foldable display apparatus 100 includes a flexible display screen 1 and a bearer component 2. The bearer component 2 has an unfolded form (as shown in FIG. 1 and FIG. 2) and a folded form (as shown in FIG. 3). That the bearer component 2 is in the unfolded form corresponds to the unfolded form of the foldable display apparatus 100. That the bearer component 2 is in the folded form corresponds to the folded form of the foldable display apparatus 100.

There may be a plurality of shapes when the bearer component 2 is unfolded, for example, a rectangle, a circle, and a hexagon. When the bearer component 2 is unfolded, there are a long side direction and a short side direction, and the short side direction is approximately perpendicular to the long side direction. For example, when the bearer component 2 is unfolded, the bearer component 2 is approximately rectangular. A direction in which a long side of the bearer component 2 is located is a long side direction X, and a direction in which a short side of the bearer component 2 is located is a short side direction Y.

The bearer component 2 includes a first plane part 21, a first bending part 22, a second plane part 23, a second bending part 24, and a third plane part 25 that are sequentially connected in the long side direction X. A length of the first bending part 22 in the long side direction X is greater than a length of the second bending part 24 in the long side direction X. Lengths of the first plane part 21, the second plane part 23, and the third plane part 25 in the long side direction X may be the same or different. Lengths of parts of the bearer component 2 in the short side direction Y are consistent. When the bearer component 2 changes a form, the first plane part 21, the second plane part 23, and the third plane part 25 maintain a plane state, the first bending part 22 is bent or unfolded, and the second bending part 24 is bent or unfolded.

The first plane part 21, the first bending part 22, the second plane part 23, the second bending part 24, and the third plane part 25 jointly bear the flexible display screen 1. In other words, when the bearer component 2 is unfolded, the flexible display screen 1 is attached to a surface of the bearer component 2. When the first bending part 22 and the second bending part 24 are bent and deformed, the third plane part 25 is folded between the first plane part 21 and the second plane part 23. In addition, parts of the flexible display screen (corresponding to a first plane display area 11 and a second plane display area 13 in the following), borne by the first plane part 21 and the second plane part 23 are exposed.

In this implementation, when the bearer component 2 is unfolded, the first plane part 21, the first bending part 22, the second plane part 23, the second bending part 24, and the third plane part 25 are coplanar, and the entire flexible display screen 1 is unfolded and can be used for display. Therefore, the foldable display apparatus 100 can implement large-screen display, and a display area is relatively large. When the bearer component 2 is folded, the bearer component 2 can fold the third plane part 25 between the first plane part 21 and the second plane part 23 through bending and deformation of the first bending part 22 and the second bending part 24. In this way, a length of the bearer component 2 is only about one third of a length of the bearer component 2 when the bearer component 2 is unfolded, and the foldable display apparatus 100 is convenient to carry. Therefore, the foldable display apparatus 100 can implement large-screen display and is convenient to carry.

In addition, when the bearer component 2 is folded, the parts, of the flexible display (11, 13), borne by the first plane part 21 and the second plane part 23 are exposed. Therefore, about two thirds of the flexible display screen 1 may be used for display. In this way, a display area of the foldable display apparatus 100 in a folded state is still relatively large, so that viewing experience of a user can also be satisfied in the folded state. The foldable display apparatus 100 may display an image on a part, of the flexible display screen 11, borne by the first plane part 21, or display an image on a part, of the flexible display 13, borne by the second plane part 23, or display images on the parts, of the flexible display (11, 13), borne by the first plane part 21 and the second plane part 23 at the same time, so that the foldable display apparatus 100 has various display manners, to improve user experience.

Because the length of the first bending part 22 in the long side direction X is greater than the length of the second bending part 24 in the long side direction X, when the first bending part 22 and the second bending part 24 are bent and deformed, the third plane part 25 connected to the second bending part 24 can be folded between the second plane part 23 and the first plane part 21 connected to the first bending part 22.

As shown in FIG. 3, when the bearer component 2 is folded, with bending and deformation of the first bending part 22 and the second bending part 24, the parts, of the flexible display screen (11, 13), borne by the first plane part 21 and the second plane part 23 are exposed, and parts, of the flexible display screen (corresponding to the first bending display area 12 and the second bending display area 14 in the following), borne by the first bending part 22 and the second bending part 24 are also exposed, to further increase a display area of the foldable display apparatus 100. Therefore, a display manner of the foldable display apparatus 100 is more diversified.

In another implementation, the foldable display apparatus 100 is a tablet computer. When the bearer component 2 is in the unfolded form, an entire screen of the flexible display screen 1 is approximately coplanar, and can be used for display at the same time, so that the foldable display apparatus 100 can perform large-screen display, and viewing experience of a user during watching a video or playing a game is excellent. When the bearer component 2 is in the folded form, the first plane part 21, the second plane part 23, and the third plane part 25 are disposed in an overlapping manner, so that plane space occupied by the foldable display apparatus 100 is greatly reduced, and the user may hold the foldable display apparatus 100 or place the foldable display apparatus 100 in a relatively small storage bag. In addition, parts, of the flexible display screen 1, borne by the first plane part 21 and the second plane part 23 are exposed, and can still be used for display (for example, display a short message, and weather information). In this case, a part, of the flexible display screen 1, borne by the third plane part 25 is hidden inside, and is not used for display.

In another implementation, the foldable display apparatus 100 is a wearable device. For example, the foldable display apparatus 100 is a watch. The foldable display apparatus 100 includes a watch face and a watch band. The watch face includes the flexible display screen 1 and the bearer component 2. When the user wears the foldable display apparatus 100 or does not wear the foldable display apparatus 100, the bearer component 2 can implement the folded form and the unfolded form. When the bearer component 2 is folded, a display area of an exposed part of the flexible display screen 1 is approximately the same as that of the watch face, and information such as time, weather, and motion data can be displayed on the exposed part of the flexible display screen 1. In addition, when the user wears the foldable display apparatus 100, the bearer component 2 in the folded form can reduce a risk that the user collides with and damages the foldable display apparatus 100 during movement. When the user does not wear the foldable display apparatus 100, the bearer component 2 in a folded form facilitates the user to storage the foldable display apparatus 100. When the bearer component 2 is unfolded, the entire screen of the flexible display screen 1 is used for display, and a display area is far greater than an area of the watch face, to implement large-screen display.

The flexible display screen 1 may be an organic light emitting diode (organic light emitting diode, OLED) display screen. An organic light emitting diode is a current-type semiconductor light emitting device based on an organic material, and includes a transparent electrode layer, a hole transport layer, an organic light emitting layer, an electron transport layer, and a metal electrode layer that are of an indium tin oxides semiconductive thin film (indium tin oxides, ITO). A principle of the organic light emitting diode is that the transparent electrode layer and the metal electrode layer are respectively used as an anode and a cathode of a device. Driven by a specific voltage, an electron and a hole are respectively injected from the cathode and the anode to the electron transport layer and the hole transport layer, the electron and the hole are respectively migrated to the organic light emitting layer through the electron transport layer and the hole transport layer, and meet at the organic light emitting layer, to form an exciton to stimulate a luminous molecule, and emit visible light through radiation. The organic light emitting diode is colorized through a method of combining red, blue, and green pixels, a color conversion method (color conversion method, CCM), a white light and color filter method, a micro-resonant cavity color method, and a multi-layer stacking method. Substrate materials of the organic light emitting diode mainly include ultra-thin glass, metal foil, and polymer. When a thickness of the glass decreases to 50 µm (micrometer) to 200 µm (micrometer), the glass can be bent and can be folded.

The flexible display screen 1 may be a touch display screen, to implement a display function and a touch function. In other words, when displaying an image, the flexible display screen 1 can sense a touch action of the user, to interact with the user. For example, a touch layer may be embedded in the organic light emitting diode display screen, so that the organic light emitting diode display screen has the touch function. Alternatively, a touchscreen is disposed, and the touchscreen and the organic light emitting diode display screen are disposed in a stacked manner, so that a display module formed by the touchscreen and the organic light emitting diode display screen has the display function and the touch function.

It may be understood that, in another implementation manner, positions of the first plane part 21 and the third plane part 23 may be interchanged.

In this application, referring to FIG. 1 to FIG. 3, the foldable display apparatus 100 further includes a first housing 3. The foldable display apparatus 100 further includes a plurality of components (not shown in the figure). The plurality of components include a battery, an antenna, a camera, an electronic control board, a speaker, an earpiece, a sensor (such as a photosensor and an infrared sensor), and the like. The plurality of components are accommodated in the first housing 3.

There are a plurality of connection relationships between the first housing 3 and the bearer component 2.

Referring to FIG. 1 to FIG. 3, in a first implementation, the first housing 3 is fastened to a side, of the second plane part 23, away from the flexible display screen 1. When the bearer component 2 is folded, the first housing 3 is located between the third plane part 25 and the second plane part 23. In a process in which the bearer component 2 changes from the unfolded state to the folded state, the second bending part 24 is bent first, so that the third plane part 25 moves to a side, of the first housing 3, away from the second plane part 23. Then, the first bending part 22 is bent, so that the first plane part 21 is located on a side, of the third plane part 25, away from the first housing 3.

In this implementation, because the plurality of components of the foldable display apparatus 100 are all disposed in the first housing 3, and the first housing 3 is fastened to the side, of the second plane part 23, away from the flexible display screen 1, when the bearer component 2 is folded, the first housing 3 is located between the third plane part 25 and the second plane part 23. The foldable display apparatus 100 does not need to reserve a thickness between the first plane part 21 and the third plane part 25 for arrangement of another device, and the first plane part 21 and the third plane part 25 may be compactly arranged. This reduces an overall thickness of the foldable display apparatus 100 during folding, and improves portability of the foldable display apparatus 100.

Figure 4:
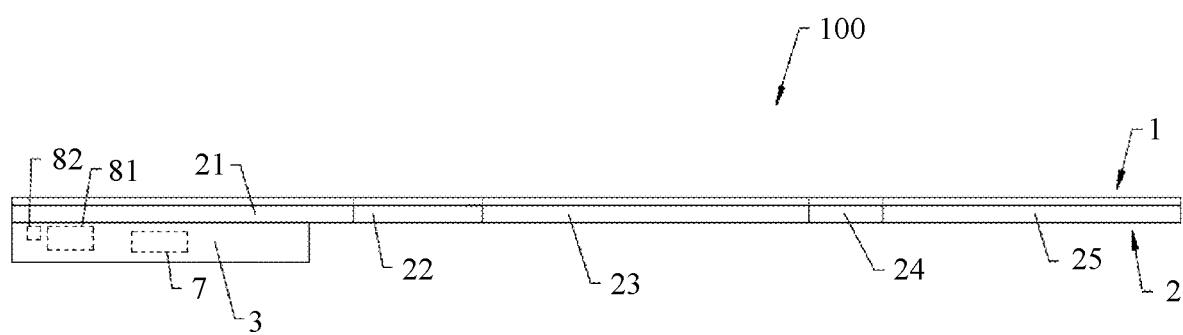
FIG. 4 is a schematic structural diagram of another optional foldable display apparatus in an unfolded state according to an implementation of this application.
Figure 5:
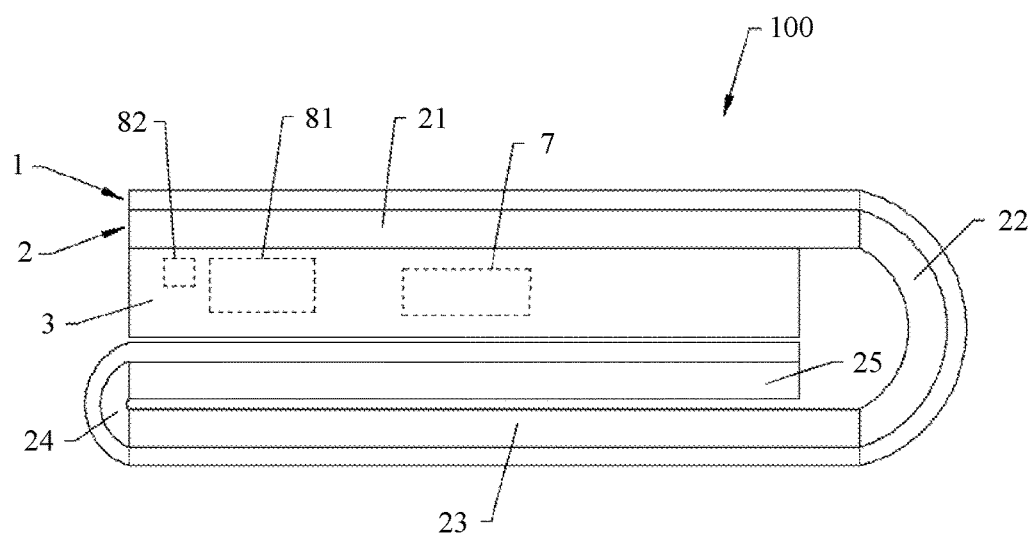
FIG. 5 is a schematic structural diagram when the foldable display apparatus shown in FIG. 4 is in a folded state.

Referring to FIG. 4 and FIG. 5, in a second implementation, the first housing 3 is fastened to a side, of the first plane part 21, away from the flexible display screen 1. When the bearer component 2 is folded, the first housing 3 is located between the third plane part 25 and the first plane part 21. In a process in which the bearer component 2 changes from the unfolded state to the folded state, the second bending part 24 is bent first, so that the third plane part 25 moves close to a bottom side of the second plane part 23. Then, the first bending part 22 is bent, so that the third plane part 25 and the second plane part 23 move, at the same time, close to a side, of the first housing 3, away from the first plane part 21, and the third plane part 25 is located between the first housing 3 and the second plane part 23.

In this implementation, because the plurality of components of the foldable display apparatus 100 are all disposed in the first housing 3, and the first housing 3 is fastened to the side, of the first plane part 21, away from the flexible display screen 1, when the bearer component 2 is folded, the first housing 3 is located between the third plane part 25 and the first plane part 21. The foldable display apparatus 100 does not need to reserve a thickness between the second plane part 23 and the third plane part 25 for arrangement of another device, and the second plane part 23 and the third plane part 25 may be compactly arranged. This reduces an overall thickness of the foldable display apparatus 100 during folding, and improves portability of the foldable display apparatus 100.

Figure 6:
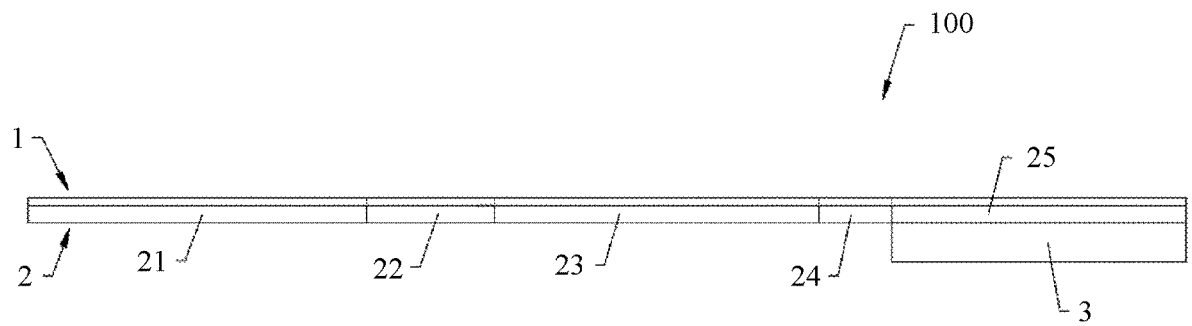
FIG. 6 is a schematic structural diagram of still another optional foldable display apparatus in an unfolded state according to an implementation of this application.
Figure 7:
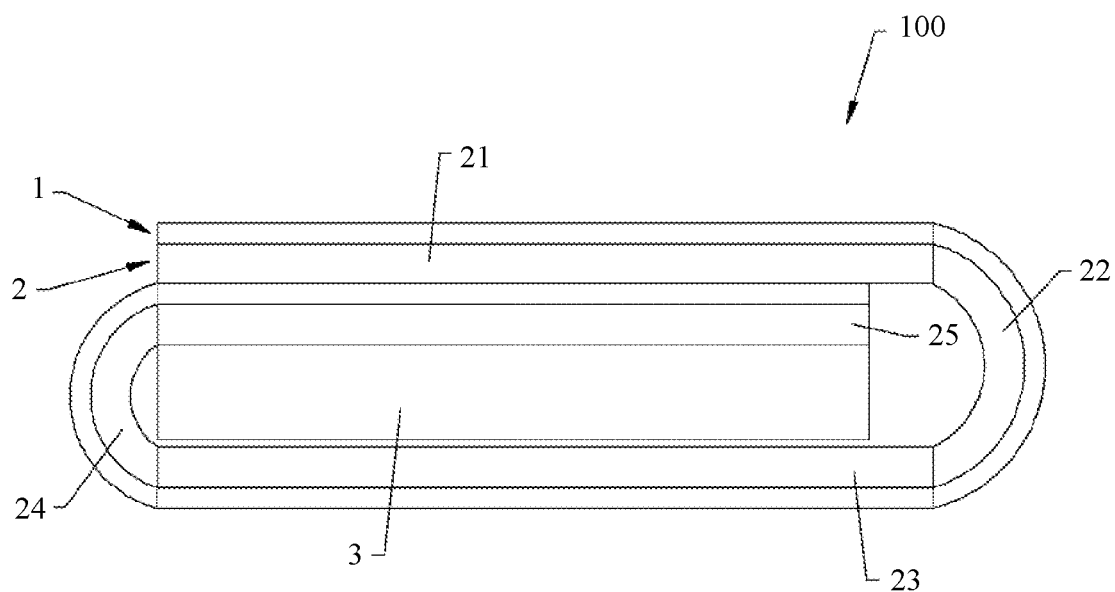
FIG. 7 is a schematic structural diagram when the foldable display apparatus shown in FIG. 6 is in a folded state.

Referring to FIG. 6 and FIG. 7, in a third implementation, the first housing 3 is fastened to a side, of the third plane part 25, away from the flexible display screen 1. When the bearer component 2 is folded, the first housing 3 is located between the third plane part 25 and the second plane part 23. In a process in which the bearer component 2 changes from the unfolded state to the folded state, the second bending part 24 is bent first, so that the second plane part 23 and the first plane part 21 move, at the same time, close to a side, of the first housing 3, away from the third plane part 25. Then, the first bending part 22 is bent, so that the first plane part 21 moves to a side, of the third plane part 25, away from the first housing 3.

In this implementation, because the plurality of components of the foldable display apparatus 100 are all disposed in the first housing 3, and the first housing 3 is fastened to the side, of the third plane part 25, away from the flexible display screen 1, when the bearer component 2 is folded, the first housing 3 is located between the third plane part 25 and the first plane part 21. The foldable display apparatus 100 does not need to reserve a thickness between the second plane part 23 and the third plane part 25 for arrangement of another device, and the second plane part 23 and the third plane part 25 may be compactly arranged. This reduces an overall thickness of the foldable display apparatus 100 during folding, and improves portability of the foldable display apparatus 100.

Figure 8:
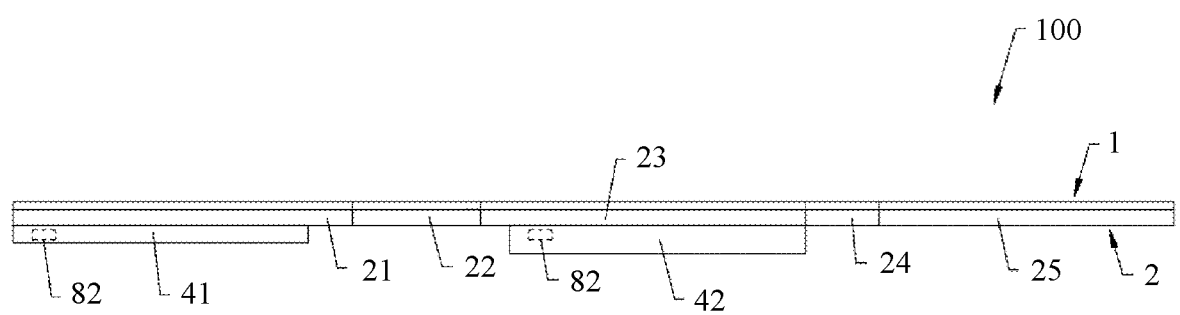
FIG. 8 is a schematic structural diagram of yet another optional foldable display apparatus in an unfolded state according to an implementation of this application.
Figure 9:
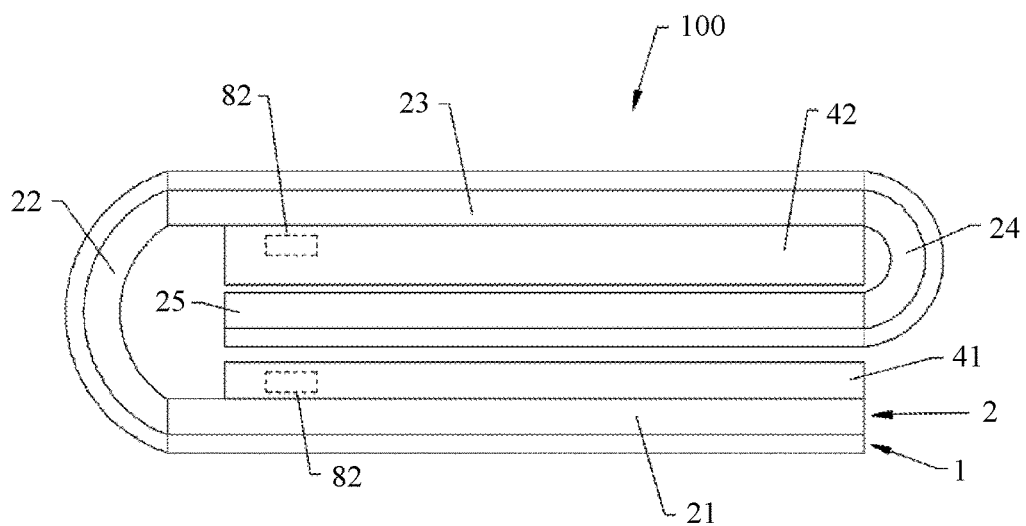
FIG. 9 is a schematic structural diagram when the foldable display apparatus shown in FIG. 8 is in a folded state.

In this application, referring to FIG. 8 and FIG. 9, the foldable display apparatus 100 may alternatively include a first housing 41 and a second housing 42. A thickness of the first housing 41 is different from a thickness of the second housing 42. The first housing 41 and the second housing 42 are fastened to two plane parts (the first plane part 21, the second plane part 23, and the third plane part 25) of the bearer component 2. A size of the first housing 41 in a vertical direction of a plane part to which the first housing 41 is fastened is the thickness of the first housing 41. A size of the second housing 42 in a vertical direction of a plane part to which the second housing 42 is fastened is the thickness of the second housing 42.

The plurality of components of the foldable display apparatus 100 may be arranged in the first housing 41 and the second housing 42 based on a requirement. For example, the thickness of the first housing 41 is less than the thickness of the second housing 42. A device with a relatively small thickness may be placed in the first housing 41, and a device with a relatively large thickness may be placed in the second housing 42, to improve space utilization of the first housing 41 and the second housing 42, and further reduce a thickness of an overall thickness of the foldable display apparatus 100 in the folded state. In another implementation, the thickness of the first housing 41 may alternatively be greater than the thickness of the second housing 42.

There are a plurality of connection relationships between the first housing 41, the second housing 42, and the bearer component 2.

Referring to FIG. 8 and FIG. 9, in a first implementation, the first housing 41 is fastened to a side, of the first plane part 21, away from the flexible display screen 1. The second housing 42 is fastened to a side, of the second plane part 23, away from the flexible display screen 1. When the bearer component 2 is folded, the third plane part 25 is located between the first housing 41 and the second housing 42. In a process in which the bearer component 2 changes from the unfolded state to the folded state, the second bending part 24 is bent first, so that the third plane part 25 moves close to a side, of the second housing 42, away from the second plane part 23. Then, the first bending part 22 is bent, so that the first plane part 21 and the first housing 41 move, at the same time, close to a side, of the third plane part 25, away from the first housing 41.

Figure 10:
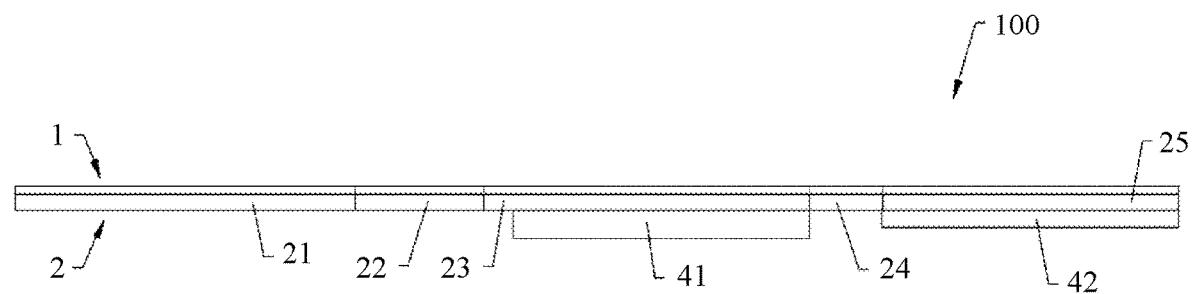
FIG. 10 is a schematic structural diagram of still yet another optional foldable display apparatus in an unfolded state according to an implementation of this application.
Figure 11:
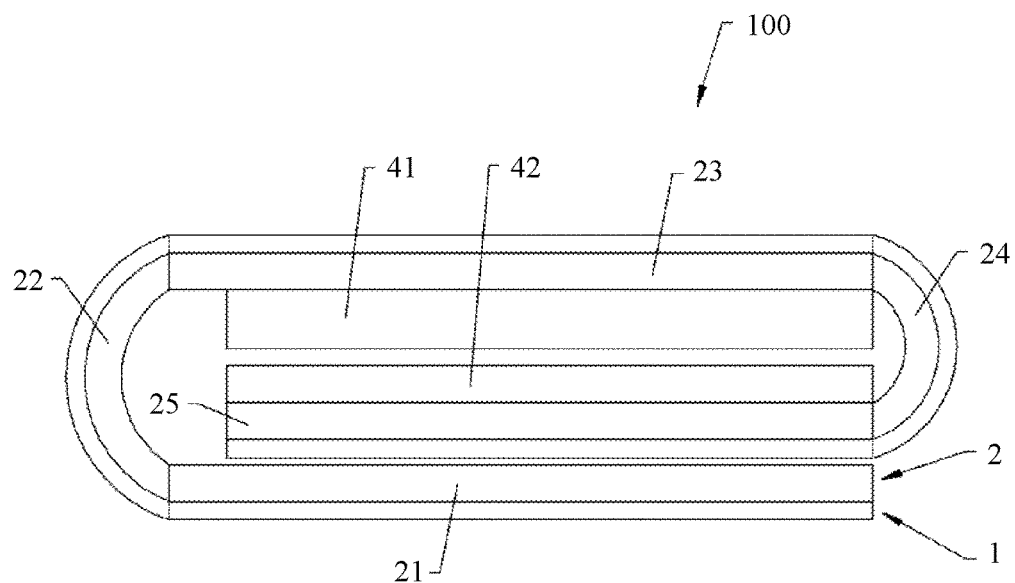
FIG. 11 is a schematic structural diagram when the foldable display apparatus shown in FIG. 10 is in a folded state.

Referring to FIG. 10 and FIG. 11, in a second implementation, the first housing 41 is fastened to a side, of the second plane part 23, away from the flexible display screen 1. The second housing 42 is fastened to a side, of the third plane part 25, away from the flexible display screen 1. When the bearer component 2 is folded, the first housing 41 and the second housing 42 are located between the second plane part 23 and the third plane part 25. In a process in which the bearer component 2 changes from the unfolded state to the folded state, the second bending part 24 is bent first, so that the third plane part 25 and the second housing 42 move, at the same time, close to a side, of the first housing 41, away from the second plane part 23. Then, the first bending part 22 is bent, so that the first plane part 21 moves close to a side, of the third plane part 25, away from the second housing 42.

Figure 21:
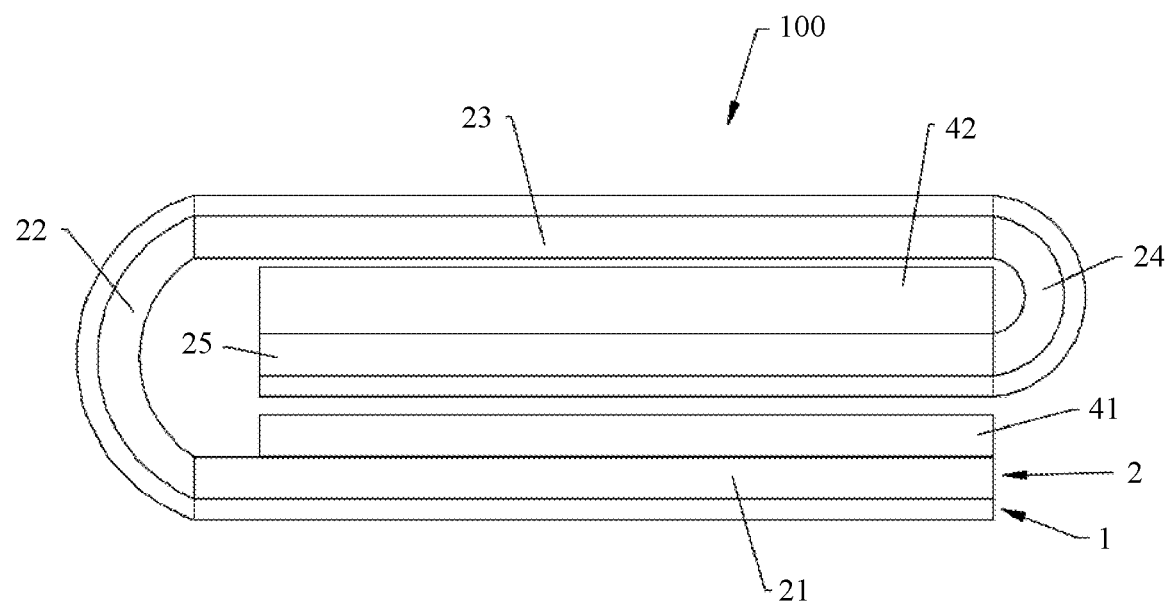
FIG. 21 is a schematic structural diagram of a still yet further optional foldable display apparatus in a folded state according to an implementation of this application.
Figure 22:
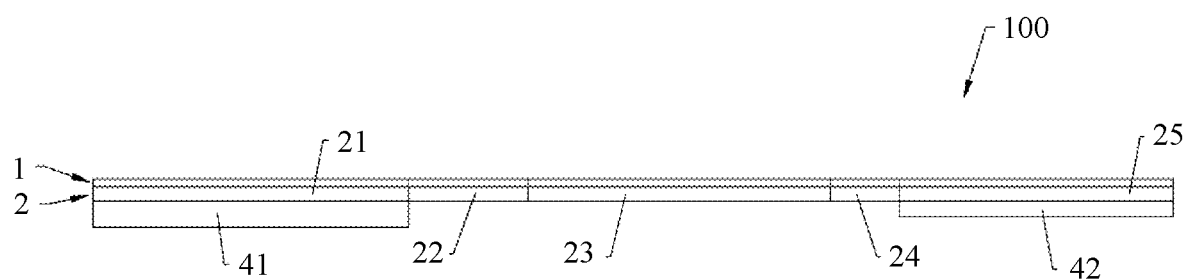
FIG. 22 is a schematic structural diagram when the foldable display apparatus shown in FIG. 21 is in an unfolded state.

Referring to FIG. 21 and FIG. 22, in a third implementation, the first housing 41 is fastened to a side, of the first plane part 21, away from the flexible display screen 1. The second housing 42 is fastened to a side, of the third plane part 25, away from the flexible display screen 1. When the bearer component 2 is folded, the first housing 41 is located between the first plane part 21 and the third plane part 25, and the second housing 42 is located between the second plane part 23 and the third plane part 25. In a process in which the bearer component 2 changes from the unfolded state to the folded state, the second bending part 24 is bent first, so that the third plane part 25 and the second housing 42 move, at the same time, close to a side, of the second plane part 23, away from the flexible display screen 1. Then, the first bending part 22 is bent, so that the first plane part 21 and the first housing 41 move, at the same time, close to a side, of the third plane part 25, away from the second housing 42.

Figure 23:
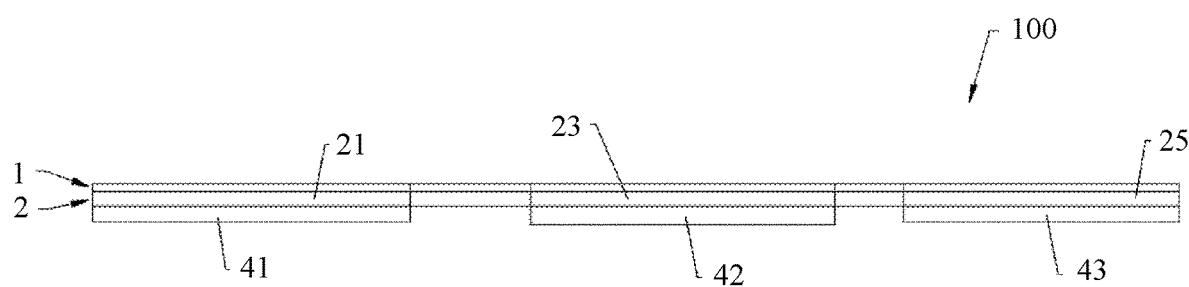
FIG. 23 is a schematic structural diagram of a still yet further optional foldable display apparatus in a folded state according to an implementation of this application.

In this application, referring to FIG. 23, the foldable display apparatus 100 may alternatively include a first housing 41, a second housing 42, and a third housing 43. A thickness relationship among the first housing 41, the second housing 42, and the third housing 43 is not limited in this application. The first housing 41 is fastened to a side, of the first plane part 21, away from the flexible display screen 1, the second housing 42 is fastened to a side, of the second plane part 23, away from the flexible display screen 1, and the third housing 43 is fastened to a side, of the third plane part 25, away from the flexible display screen 1.

In this application, the first bending part 22 and the second bending part 24 that are of the bearer component 2 have a folded state, an unfolded state, and a plurality of unfolded states at different angles. The first bending part 22 and the second bending part 24 have a plurality of implementations. The following is an example.

Figure 12:
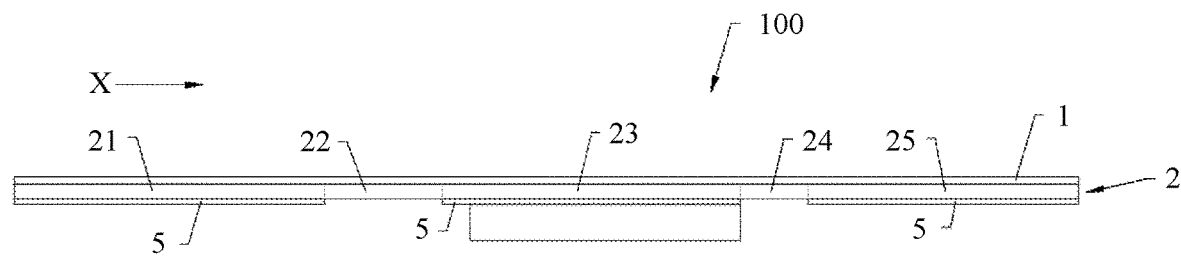
FIG. 12 is a schematic structural diagram of a further optional foldable display apparatus in an unfolded state according to an implementation of this application.

Referring to FIG. 12, in a first implementation, the bearer component 2 is an integrated bearing plate. In other words, the bearing plate includes the first plane part 21, the first bending part 22, the second plane part 23, the second bending part 24, and the third plane part 25. The bearing plate includes a shape-memory metal material. The bearing plate may further include another material (for example, a metal material), used to increase rigidity of the bearing plate, so that the bearing plate has a deformation capability, and can provide sufficient support for the flexible display screen 1.

The shape-memory metal is also referred to as a shape memory alloy (Shape Memory Alloys, SMA), and is an alloy material that can completely eliminate deformation of the shape-memory metal at a relatively low temperature and restore an original shape of the shape-memory metal after the shape-memory metal is heated and heated up, in other words, the alloy with a "memory" effect. In the foldable display apparatus 100, a voltage is applied to two ends of the bearing plate, so that a current flows through the bearing plate, so that the bearing plate heats up, and is restored to an original shape.

The initial shape of the bearing plate corresponds to the unfolded state of the bearer component 2, the bearer component 2 may change from the unfolded state to the folded state under external force, and when the bearing plate is powered on, the bearer component 2 is restored from the folded state to the unfolded state. Alternatively, the initial shape of the bearing plate corresponds to the folded state of the bearer component 2, the bearer component 2 may change from the folded state to the unfolded state under external force, and when the bearing plate is powered on, the bearer component 2 is restored from the unfolded state to the folded state. It may be understood that, when the bearing plate is not powered on, the bearer component 2 may also be restored to an initial state under external force.

As shown in FIG. 12, a reinforcing plate 5 may be disposed in an area, of the bearing plate, corresponding to the first plane part 21, a reinforcing plate 5 may be disposed in an area, of the bearing plate, corresponding to the second plane part 23, and a reinforcing plate 5 may be disposed in an area, of the bearing plate, corresponding to the third plane part 25. The reinforcing plate 5 and the bearing plate are disposed in a stacked manner, and the reinforcing plate 5 is used to increase rigidity of the first plane part 21, the second plane part 23, and the third plane part 25.

Referring to FIG. 2 and FIG. 3, in a second implementation, the first plane part 21, the second plane part 23, and the third plane part 25 are rigid plates. The first bending part 22 and the second bending part 24 are shape-memory plates. The shape-memory plate includes a shape-memory metal material. The shape-memory plate may further include another material (for example, a metal material), used to increase rigidity of the shape-memory plate, so that the shape-memory plate has a deformation capability, and can provide sufficient support for the flexible display screen 1.

In this implementation, the flexible display screen 1 is supported by the rigid plate and the shape-memory plate. The initial shape of the shape-memory plate corresponds to the unfolded state of the bearer component 2, the bearer component 2 may change from the unfolded state to the folded state under external force, and when the shape-memory plate is powered on, the bearer component 2 is restored from the folded state to the unfolded state. Alternatively, the initial shape of the shape-memory plate corresponds to the folded state of the bearer component 2, the bearer component 2 may change from the folded state to the unfolded state under external force, and when the shape-memory plate is powered on, the bearer component 2 is restored from the unfolded state to the folded state. It may be understood that, when the shape-memory plate is not powered on, the bearer component 2 may also be restored to an initial state under external force.

Figure 13:
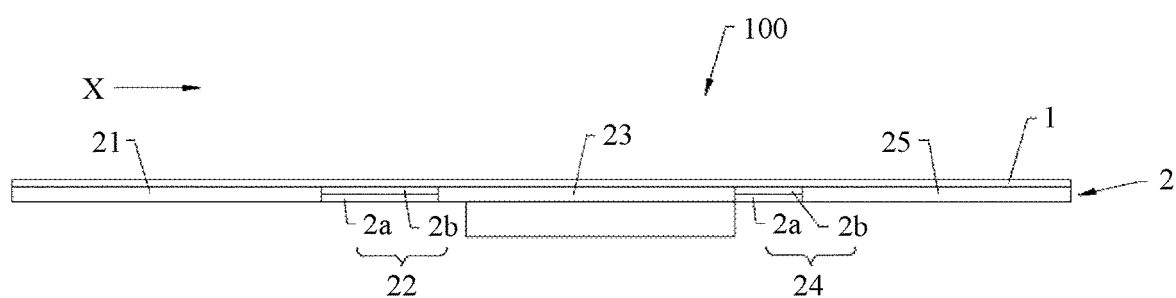
FIG. 13 is a schematic structural diagram of a still further optional foldable display apparatus in an unfolded state according to an implementation of this application.

Referring to FIG. 13, in a third implementation, the first plane part 21, the second plane part 23, and the third plane part 25 are rigid plates. The first bending part 22 and the second bending part 24 include a deformable plate 2a and a bending piece 2b. The deformable plate 2a and the bending piece 2b are disposed in a stacked manner. The deformable plate 2a includes a shape-memory metal material. The deformable plate 2a may further include another material (for example, a metal material), used to increase rigidity of the deformable plate 2a, so that the deformable plate 2a has a deformation capability, and can support the flexible display screen 1. The bending piece 2b is bent or unfolded under external force. The bending piece 2b may have a plurality of structures such as an elastic plate structure, a chain structure, a meshing gear group structure, and a rotating shaft connection structure.

In this implementation, the bending piece 2b may play a main supporting role for the flexible display screen 1, and the deformable plate 2a plays an auxiliary supporting role for the flexible display screen 1. An initial shape of the deformable plate 2a corresponds to the unfolded state of the bearer component 2, and the bearer component 2 may change from the unfolded state to the folded state under external force. When the deformable plate 2a is powered on, the deformable plate 2a drives the bending piece 2b to be unfolded, and the bearer component 2 is restored from the folded state to the unfolded state. Alternatively, an initial shape of the deformable plate 2a corresponds to the folded state of the bearer component 2, and the bearer component 2 may change from the folded state to the unfolded state under external force. When the deformable plate 2a is powered on, the deformable plate 2a drives the bending piece 2b to be bent, and the bearer component 2 is restored from the unfolded state to the folded state. It may be understood that, when the deformable plate 2a is not powered on, the bearer component 2 may also be restored to an initial state under external force.

In this application, a position-limiting structure is disposed on the foldable display apparatus 100, and the position-limiting structure is configured to enable the foldable display apparatus 100 to maintain a stable folded state, an unfolded state, and a plurality of unfolded states at different angles.

In this application, an example in which the position-limiting structure enables the foldable display apparatus 100 to maintain the stable folded state is used for description. For example, referring to FIG. 14 and FIG. 15, the foldable display apparatus 100 further includes a first position-limiting component 61 and a second position-limiting component 62. Two parts of the first position-limiting component 61 are respectively fastened to the first plane part 21 and the second plane part 23. Two parts of the second position-limiting component 62 are respectively fastened to the second plane part 23 and the third plane part 25. When the bearer component 2 is folded, the two parts of the first position-limiting component 61 cooperate with each other to fasten the first plane part 21 and the second plane part 23. The two parts of the second position-limiting component 62 cooperate with each other to fasten the second plane part 23 and the third plane part 25.

Figure 14:
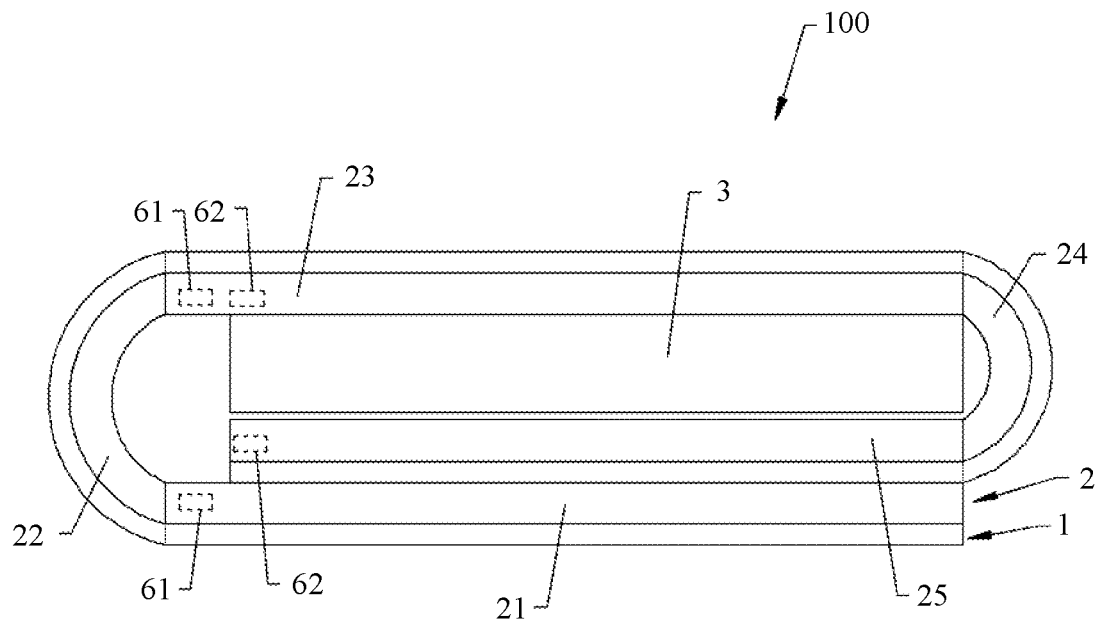
FIG. 14 is a schematic structural diagram of still another optional foldable display apparatus in a folded state according to an implementation of this application.

In an implementation, as shown in FIG. 14, the first position-limiting component 61 includes two mutually adsorbed adsorption components. The second position-limiting component 62 includes two mutually adsorbed adsorption components. The two mutually adsorbed adsorption components may be two magnets with different magnetism, or one of the two adsorption components is a magnet, and the other adsorption component is made of a material (namely, a ferromagnetic material, for example, iron, nickel, or cobalt) that may be magnetically adsorbed.

Figure 15:
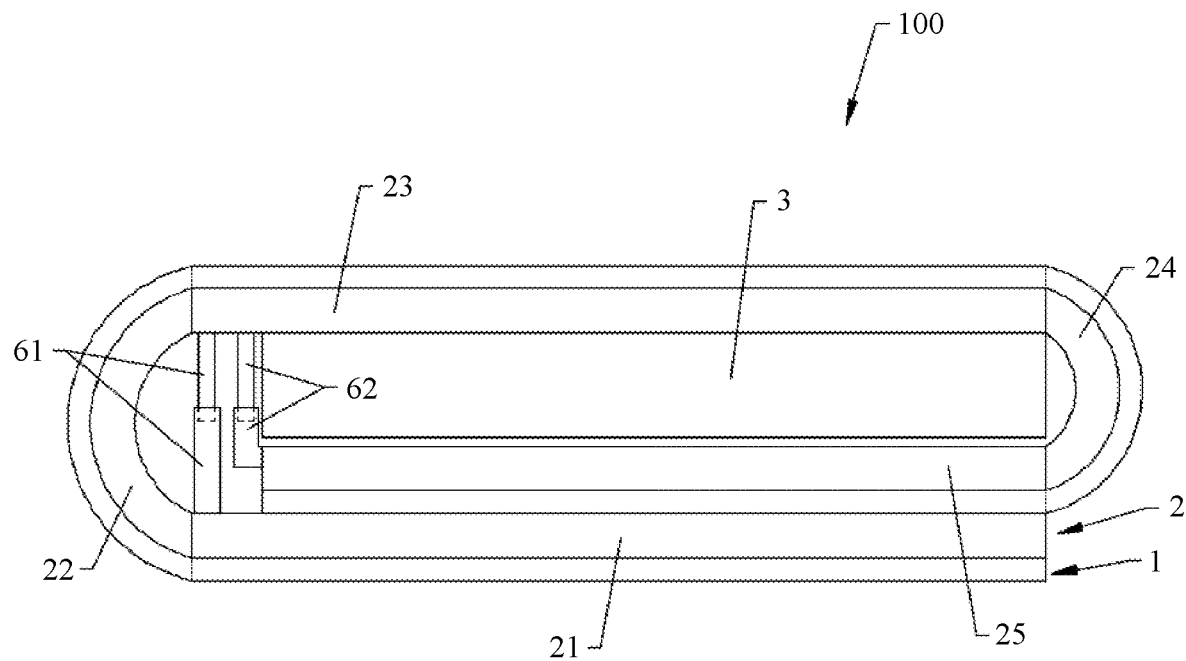
FIG. 15 is a schematic structural diagram of yet another optional foldable display apparatus in a folded state according to an implementation of this application.

In another implementation, as shown in FIG. 15, the first position-limiting component 61 includes two fasteners that can be fastened to each other. The second position-limiting component 62 includes two fasteners that can be fastened to each other.

In this application, only after a position-limiting lock state of the bearer component 2 is released, the shape-memory metal can be powered on to heat up to restore the shape-memory metal to an initial state, to assist in unfolding or folding the bearer component 2.

It may be understood that the position-limiting structure in this application may implement locking of one or more of the following positions: positions of the first plane part 21 and the second plane part 23, positions of the first plane part 21 and the third plane part 25, positions of the second plane part 23 and the third plane part 25, bending and deformation states of the first bending part 22 and the second bending part 24, unfolded states of the first bending part 22 and the second bending part 24, and unfolded states at an angle of the first bending part 22 and the second bending part 24.

Figure 16:
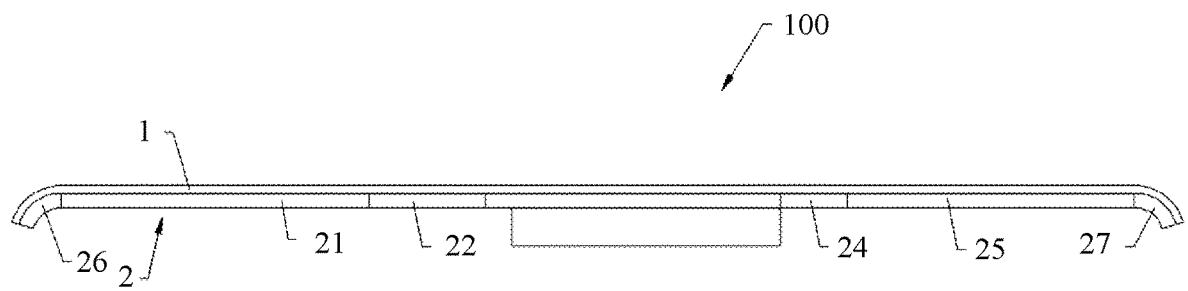
FIG. 16 is a schematic structural diagram of a yet further optional foldable display apparatus in an unfolded state according to an implementation of this application.

Referring to FIG. 16, in an implementation, the bearer component 2 further includes a first arc surface part 26 and a second arc surface part 27. The first arc surface part 26 is connected to a side, of the first plane part 21, away from the first bending part 22. The first arc surface part 26 moves with the first plane part 21. The second arc surface part 27 is connected to a side, of the third plane part 25, away from the second bending part 24. The second arc surface part 27 moves with the second plane part 23. The first arc surface part 26 and the second arc surface part 27 are also used to bear the flexible display screen 1.

In this implementation, disposing of the first arc surface part 26 and the second arc surface part 27 increases an area that is of the bearer component 2 and that can be used to bear the flexible display screen 1, to increase a display area of the flexible display screen 1, and a display area of the foldable display apparatus 100 is larger. In addition, the first arc surface part 26 and the second arc surface part 27 are disposed, so that the foldable display apparatus 100 has a 2.5D display effect in the unfolded state, and visual experience of a user can be improved.

Referring to FIG. 1 to FIG. 3, in an implementation, the flexible display screen 1 includes a first plane display area 11, a first bending display area 12, a second plane display area 13, a second bending display area 14, and a third plane display area 15. The first plane display area 11 overlaps the first plane part 21. The first plane display area 11 moves with the first plane part 21. The first bending display area 12 overlaps the first bending part 22. The first bending display area 12 moves with the first bending part 22. The second plane display area 13 overlaps the second plane part 23. The second plane display area 13 moves with the second plane part 23. The second bending display area 14 overlaps the second bending part 24. The second bending display area 14 moves with the second bending part 24. The third plane display area 15 overlaps the third plane part 25. The third plane display area 15 moves with the third plane part 25.

The foldable display apparatus 100 further includes a controller 7. The controller 7 is fastened in the first housing 3. The controller 7 is electrically connected to the flexible display 1. The controller 7 is configured to light up or turn off at least one of the first plane display area 11, the first bending display area 12, the second plane display area 13, the second bending display area 14, and the third plane display area 15.

When the foldable display apparatus 100 is in the unfolded state, the controller 7 may light up or turn off the entire flexible display screen 1 at the same time. The controller 7 may further exchange information with the flexible display screen 1, so that the flexible display screen 1 displays an image. When the flexible display screen 1 has a touch function, the controller 7 may further receive a touch signal of the flexible display screen 1.

When the foldable display apparatus 100 is in the folded state, the first plane display area 11 and the second plane display area 13 are respectively located on a front side and a rear side of the foldable display apparatus 100. The controller 7 may light up at least one of the first plane display area 11 or the second plane display area 13, and other areas of the flexible display screen 1 remain an off state, to meet a viewing requirement of the user, and reduce energy consumption of the foldable display apparatus 100.

In another implementation, as shown in FIG. 8, when the foldable display apparatus 100 includes the first housing 41 and the second housing 42, the controller (not shown in the figure) may be disposed in the first housing 41 or disposed in the second housing 42.

Figure 24:
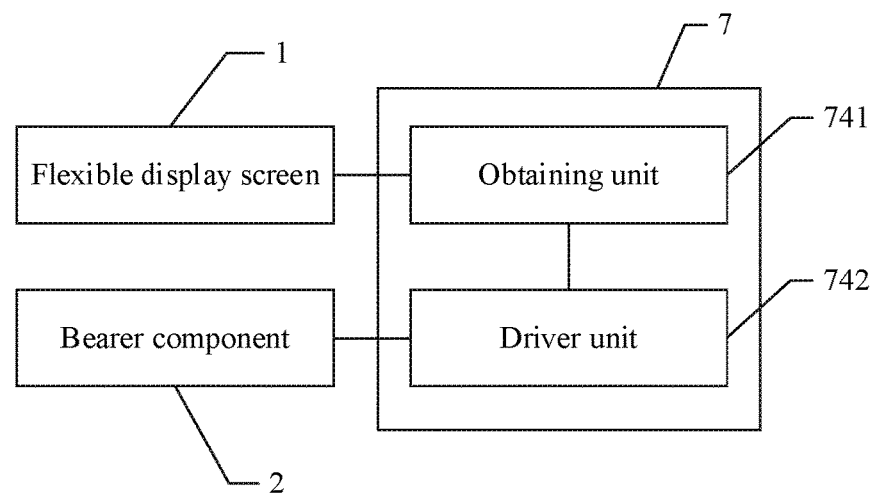
FIG. 24 is a schematic block diagram of still yet another optional controller of a foldable display apparatus according to an implementation of this application.

In an implementation, referring to FIG. 24 together, the controller 7 includes a receiving unit 741 and a driver unit 742. For structures of the flexible display screen 1 and the bearer component 2, refer to FIG. 3.

The receiving unit 741 is configured to receive a folding instruction. When detecting a first operation of a user, the flexible display screen 1 sends the folding instruction to the receiving unit 741. The first operation corresponds to an operation of changing the bearer component 2 to a folded state, for example, a touch action such as a tap, a double tap, a touch and hold, or a slide.

The driver unit 742 is configured to: when the receiving unit 741 receives the folding instruction, drive the bearer component 2 to change to the folded state, and the third plane part 25 is folded between the first plane part 21 and the second plane part 23. In addition, parts, of the flexible display screen (corresponding to the first plane display area 11 and the second plane display area 13), borne by the first plane part 21 and the second plane part 23 are exposed.

The receiving unit 741 is further configured to receive an unfolding instruction. When detecting a second operation of the user, the flexible display screen 1 sends the unfolding instruction to the receiving unit 741. The second operation corresponds to an operation of changing the bearer component 2 to an unfolded state, for example, a touch action such as a tap, a double tap, a touch and hold, or a slide.

The driver unit 742 is further configured to: when the receiving unit 741 receives the unfolding instruction, drive the bearer component 2 to change to the unfolded state, and the first plane part 21, the second plane part 23, and the third plane part 25 are unfolded to a same plane with each other. In this case, the flexible display screen 1 is unfolded, so that large-screen display can be implemented.

In this application, when the foldable display apparatus 100 is in the folded state, the foldable display apparatus 100 may further implement a plurality of interaction functions with the user through the controller 7 and another component. The following is an example.

In an implementation, referring to FIG. 2 to FIG. 5, the foldable display apparatus 100 further includes a camera 81 and a sensor 82. The camera 81 may collect an image. The sensor 82 may detect a distance between the foldable display apparatus 100 and the user. The camera 81 and the sensor 82 are accommodated in the first housing 3. Collection surfaces of the camera 81 and the sensor 82 face the flexible display screen 1.

In this application, the first housing 3 may be fastened to the first plane part 21 (as shown in FIG. 4 and FIG. 5) or the second plane part 23 (as shown in FIG. 2 and FIG. 3). In this way, the camera 81 and the sensor 82 may correspond to the first plane display area 11 or the second plane display area 13 of the flexible display screen 1. When the foldable display apparatus 100 is folded, the first plane display area 11 and the second plane display area 13 are respectively located on a front side and a rear side of the foldable display apparatus 100. Therefore, the foldable display apparatus 100 may implement selfie shooting (also referred to as front-facing shooting) and mutual shooting (also referred to as rear-facing shooting) by using a same camera 81. Collection surfaces of the camera 81 and the sensor 82 face a same direction as a part, of the flexible display screen, relatively fastened to the camera 81 and the sensor 82. For example, the camera 81 and the sensor 82 are fastened relative to the first plane part 21, a collection surface of the camera 81 faces the first plane display area 11, and a collection surface of the sensor 82 faces the first plane display area 11. When the first plane display area 11 faces the user, the user may take a selfie by using the camera 81, and the first plane display area 11 displays a shot picture. When the second plane display area 13 faces the user, the user may perform mutual shooting by using the camera 81, and the second plane display area 13 displays a shot picture.

Figure 17:
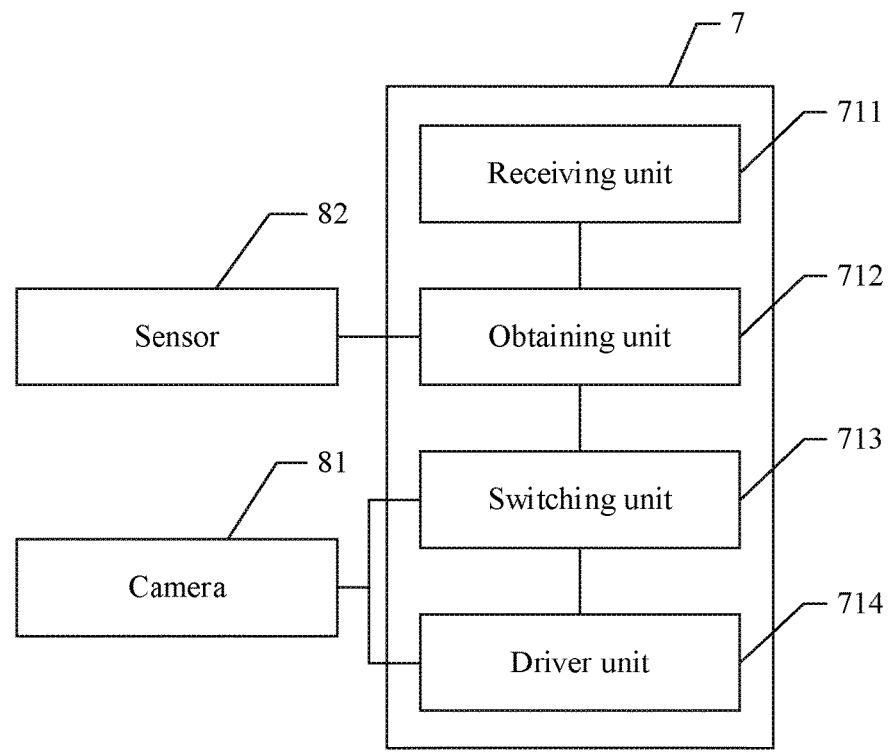
FIG. 17 is a schematic block diagram of an optional controller of a foldable display apparatus according to an implementation of this application.

Referring to FIG. 17 together, the controller 7 includes a receiving unit 711, an obtaining unit 712, a switching unit 713, and a driver unit 714.

The receiving unit 711 is configured to receive a shooting instruction. For example, when detecting that the user starts the camera 82 to perform a touch action of shooting, the flexible display screen 1 sends the shooting instruction to the receiving unit 711.

The obtaining unit 712 is configured to: when the receiving unit 711 receives the shooting instruction, obtain a distance between the foldable display apparatus 100 and the user through the sensor 82.

The switching unit 713 is configured to switch a shooting mode of the camera 81 to a self-shooting mode or the mutual shooting mode based on the distance. When the user distance is less than or equal to a preset value, it is determined that the camera 81 faces the user, and the switching unit 713 switches the shooting mode of the camera 81 to the self-shooting mode. When the user distance is greater than the preset value, or when the sensor 82 cannot recognize the user, it is determined that the camera 81 is away from the user, and the switching unit 713 switches the shooting mode of the camera to the mutual shooting mode.

The driver unit 714 is configured to receive shooting mode information of the switching unit 713, and start the camera 81 to shoot. In other words, when the camera 81 faces the user, the driver unit 714 drives the camera 81 to shoot in the self-shooting mode. When the camera 81 is away from the user, the driver unit 714 drives the camera 81 to shoot in the mutual shooting mode.

In this application, because the foldable display apparatus 100 may automatically switch the shooting mode of the camera 81 based on an environment in which the user uses the camera 81, different image processing algorithms are run in different shooting modes. For example, in the self-shooting mode, beautification may be implemented according to an algorithm, and in the mutual shooting mode long-range blurring and the like may be implemented through an algorithm. In this way, shooting quality of the foldable display apparatus 100 is better, and user experience is improved.

In an implementation, referring to FIG. 2 to FIG. 5, the foldable display apparatus 100 further includes a recognition component. The recognition component includes one or more of the camera 81 and the sensor 82. The recognition component (81/82) is fastened to the first housing 3. The first housing 3 is fastened to the first plane part 21 or the second plane part 23.

Referring to FIG. 2 and FIG. 3, in this application, an example in which the first housing 3 is fastened to the second plane part 23 is used for description. The recognition component (81/82) and a part of the display area (namely, the second plane display area 13), of the flexible display screen 1, borne by the second plane part 23 face a same direction.

Figure 18:
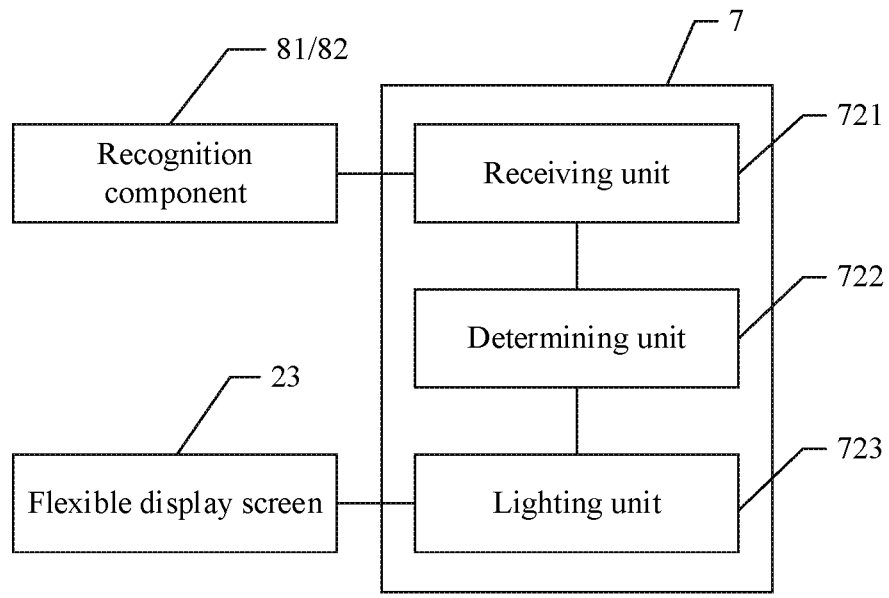
FIG. 18 is a schematic block diagram of another optional controller of a foldable display apparatus according to an implementation of this application.

Referring to FIG. 18, the controller 7 includes a receiving unit 721, a determining unit 722, and a lighting unit 723.

The receiving unit 721 is configured to receive recognition information of the recognition component (81/82). When detecting a wake-up action of the user, the flexible display screen 1 drives the recognition component (81/82) to recognize, and sends recognition information to the receiving unit 721.

The determining unit 722 is configured to determine, based on the recognition information, whether the recognition component (81/82) faces the user or is away from the user.

The lighting unit 723 is configured to: when the recognition component (81/82) faces the user, light up the part of the display area (namely, the second plane display area 13), of the flexible display screen 1, borne by the second plane part 23. The lighting unit 723 is further configured to: when the recognition component (81/82) is away from the user, light up a part of the display area (namely, the first plane display area 11), of the flexible display screen 1, borne by the first plane part 21. The part of the display area that is of the flexible display screen 1 and that is lit up displays screen content.

The recognition component may be the camera 81. The recognition information is a shot image collected by the camera 81. The shot image is compared with an image prestored in a memory 102, to determine whether the recognition component faces the user or is away from the user. For example, the prestored image is a user facial image (or another recognition image such as a pupil image). When the shot image collected by the camera 81 is the same as the prestored image, it is determined that the recognition component faces the user. When the shot image collected by the camera 81 is different from the prestored image, it is determined that the recognition component is away from the user.

The recognition component may also be the sensor 82. The sensor 82 may detect a distance between the foldable display apparatus 100 and the user. When detecting that the distance between the foldable display apparatus 100 and the user is less than or equal to a threshold, the sensor 82 determines that the recognition component faces the user. When detecting that the distance between the foldable display apparatus 100 and the user is greater than a threshold, the sensor 82 determines that the recognition component is away from the user. When the sensor 82 cannot recognize the user, it is also determined that the recognition component is away from the user.

The camera 81 and the sensor 82 may determine the user by recognizing a face, a pupil, or another biometric feature of the user.

In this application, the foldable display apparatus 100 may collect user position information through the recognition component (81/82), to determine a relative position relationship between the first plane part 21 and the user and a relative position relationship between the second plane part 23 and the user, and further light up the part of the display area (namely, the first plane display area 11 or the second plane display area 13), of the flexible display screen 1, facing the user. This improves user experience of the foldable display apparatus 100.

It may be understood that, for example, the recognition component is the sensor 82. As shown in FIG. 4 and FIG. 5, when the first housing 3 is fastened to the first plane part 21, the collection surface of the sensor 82 faces the first plane display area 11. The lighting unit 723 is further configured to: when the recognition component (81/82) faces the user, light up the part of the display area (namely, the first plane display area 11), of the flexible display screen 1, borne by the first plane part 21. The lighting unit 723 is configured to: when the recognition component is away from the user, light up the part of the display area (namely, the second plane display area 13), of the flexible display screen 1, borne by the second plane part 23.

In another implementation, for example, the recognition component is the sensor 82. As shown in FIG. 8 and FIG. 9, when the foldable display apparatus 100 includes the first housing 41 and the second housing 42, and the first housing 41 is fastened to the first plane part 21, and the second housing 42 is fastened to the second plane part 23, the foldable display apparatus 100 may be provided with the sensor 82 in each of the first housing 41 and the second housing 42, and the sensor 82 is electrically connected to the controller 7. Through the controller 7 and the sensor 82, the first plane display area 11 is automatically lit up when the first plane display area 11 is relatively close to the user, and the second plane display area 13 is automatically lit up when the second plane display area 13 is relatively close to the user. Certainly, in some implementations, the recognition component may include the camera 81 and the sensor 82. The foldable display apparatus 100 may determine, through dual recognition and determining, the lit-up part of the flexible display screen 1, to improve recognition accuracy. In some implementations, the recognition component may also include another component that can be used to recognize a user position.

Figure 19:
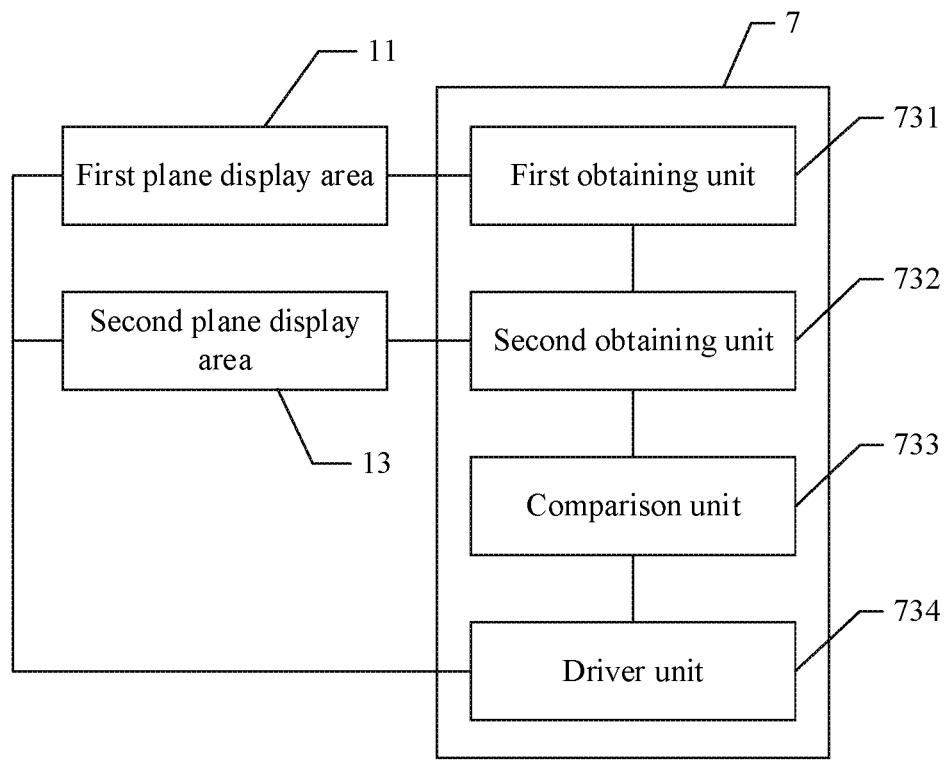
FIG. 19 is a schematic block diagram of still another optional controller of a foldable display apparatus according to an implementation of this application.

In an implementation, referring to FIG. 19, the controller 7 includes a first obtaining unit 731, a second obtaining unit 732, a comparison unit 733, and a driver unit 734. The first obtaining unit 731 is configured to obtain a first contact area that is of the first plane display area 11 and that is in contact with the user. The second obtaining unit 732 is configured to obtain a second contact area that is of the second plane display area 13 and that is in contact with the user. The comparison unit 733 is configured to compare the first contact area with the second contact area. The driver unit 734 is configured to light up the first plane display area 11 when the first contact area is less than the second contact area, or further configured to light up the first plane display area 11 when the second contact area is less than the first contact area.

For example, when the first contact area is less than the second contact area, the first plane display area 11 faces the user, the second plane display area 13 is away from the user, and the first plane display area 11 is lit up. When the second contact area is less than the first contact area, the second plane display area 13 faces the user, the first plane display area 11 is away from the user, and the second plane display area 13 is lit up. In this implementation, the foldable display apparatus 100 may automatically light up, based on a holding gesture of the user, a plane display area facing the user, to improve user experience.

Figure 20:
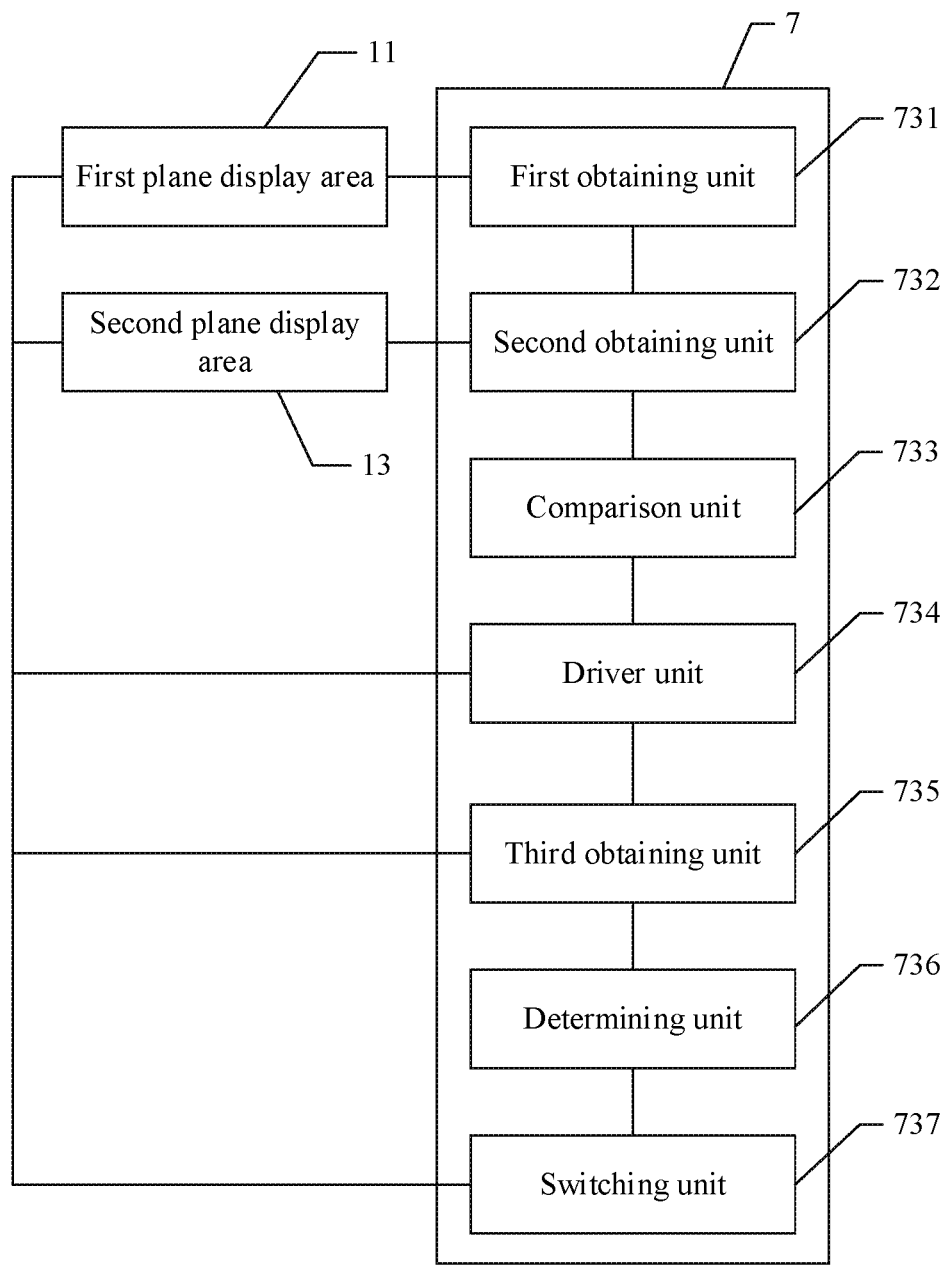
FIG. 20 is a schematic block diagram of yet another optional controller of a foldable display apparatus according to an implementation of this application.

Further, referring to FIG. 20 together, the controller 7 further includes a third obtaining unit 735, a determining unit 736, and a switching unit 737. The third obtaining unit 735 is configured to: when the first plane display area 11 is lit up, obtain a contact position at which the user touches the first plane display area 11. The determining unit 736 is configured to determine whether the contact position is located on a left-side area or a right-side area. The switching unit 737 is configured to: when the contact position is located on the left-side area, switch the first plane display area 11 to a left-hand mode screen. The switching unit 737 is further configured to: when the contact position is located on the right-side area, display a right-hand mode screen in the first plane display area 11.

In this implementation, the foldable display apparatus 100 determines a use habit of the user based on a position at which the lit-up plane display area is touched by the user, to switch a screen to the left-hand mode screen or a right-hand mode screen corresponding to the use habit of the user, to improve user experience.

The third obtaining unit 735 is further configured to: when the second plane display area 13 is lit up, obtain a second contact position at which the user touches the first plane display area 13. The determining unit 736 is further configured to determine whether the second contact position is located on the left-side area or the right-side area. The switching unit 737 is further configured to: when the second contact position is located on the left-side area, switch the second plane display area 13 to the left-hand mode screen. The switching unit 737 is further configured to: when the second contact position is located on the right-side area, display a right-hand mode screen in the second plane display area 13.

Figure 25:
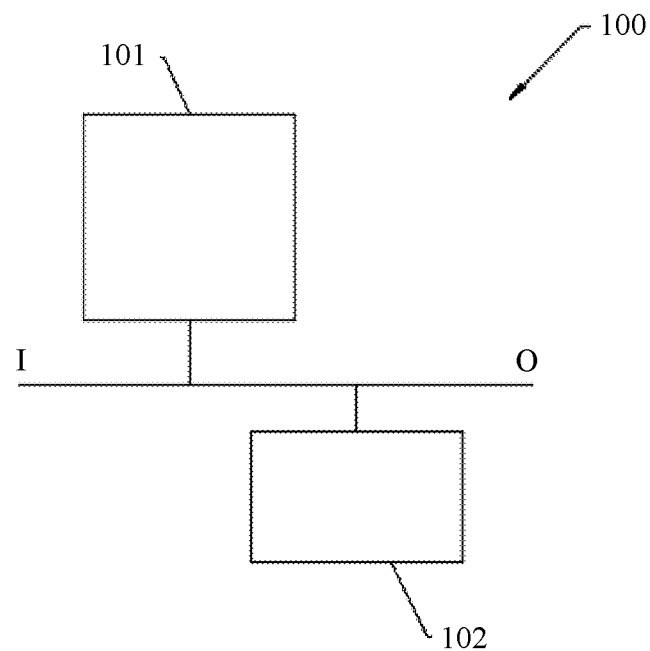
FIG. 25 is a schematic diagram of some components of a foldable display apparatus according to an implementation of this application.

In this application, referring to FIG. 25, the foldable display apparatus 100 further includes one or more processors 101, one or more memories 102, and an instruction that is stored in the one or more memories 102 and that can be executed by the one or more processors 101. For structures of the flexible display screen 1 and the bearer component 2 of the foldable display apparatus 100, refer to FIG. 2 and FIG. 3.

The one or more processors 101 execute the instruction to implement the following steps:

responding to detection of a first operation, where the first operation may be an operation of the user on the flexible display screen 1, and the first operation corresponds to an operation of changing the bearer component 2 to a folded state, for example, a touch action such as a tap, a double tap, a touch and hold, or a slide; and driving the bearer component 2 to change to the folded state, where the third plane part 25 is folded between the first plane part 21 and the second plane part 23, and parts, of the flexible display screen (corresponding to the first plane display area 11 and the second plane display area 13), borne by the first plane part 21 and the second plane part 23 are exposed.

In an implementation, the one or more processors 101 execute the instruction to further implement the following steps:

responding to detecting a second operation, where the second operation may be an operation of the user on the flexible display screen 1, and the second operation corresponds to an operation of changing the bearer component 2 to an unfolded state, for example, a touch action such as a tap, a double tap, a touch and hold, or a slide; and driving the bearer component 2 to change to the unfolded state, where the first plane part 21, the second plane part 23, and the third plane part 25 are unfolded to a same plane with each other. In this case, the flexible display screen 1 is unfolded, so that large-screen display can be implemented.

In this implementation, the foldable display apparatus 100 may automatically unfold or fold based on a requirement of the user, to improve user experience.

In FIG. 25, only one processor 101 and one memory 102 are shown. In another implementation, the foldable display apparatus 100 may include a plurality of processors 101 and a plurality of memories 102 (for example, a same processor/memory type or different processor/memory types). The foldable display apparatus 100 further includes an input I and an output O. The one or more processors 101 and the one or more memories 102 may be integrated on an application-specific integrated circuit used for a portable electronic device. The input I allows receiving a signal from another component to the processor 101 or the memory 102. The output O allows a signal to be sent from the processor 101 or the memory 102 to another component.

In an implementation, referring to FIG. 2 to FIG. 5, the foldable display apparatus 100 further includes a recognition component (81/82). The recognition component includes one or more of a camera 81, a sensor 82, or a gravity sensor (not shown in the figure). The recognition component (81/82) and the part of the display area (namely, the second plane display area 13), of the flexible display screen 1, borne by the second plane part 23 face a same direction.

The one or more processors 101 execute the instruction to implement the following steps:

responding to detection of a third operation, where the third operation may be an operation of waking up the flexible display screen 1 by the user; and controlling, based on recognition information of the recognition component (81/82), the part of the display area (namely, the second plane display area 13), of the flexible display screen 1, borne by the second plane part 23 and/or the part of the display area (namely, the first plane display area 11), of the flexible display screen 1, borne by the first plane part 21 to be used for display.

The part of the display area (namely, the second plane display area 13), of the flexible display screen 1, borne by the second plane part 23 may be controlled, based on the recognition information, to be used for independent display, and other display areas of the flexible display screen 1 are in a screen-off state. In this case, the foldable display apparatus 100 can meet a display requirement, and energy consumption is relatively low.

Alternatively, the part of the display area (namely, the first plane display area 11), of the flexible display screen 1, borne by the first plane part 21 may be controlled, based on the recognition information, to be used for independent display, and other display areas of the flexible display screen 1 are in a screen-off state. In this case, the foldable display apparatus 100 can meet a display requirement, and energy consumption is relatively low.

Alternatively, the part of the display area (namely, the second plane display area 13), of the flexible display screen 1, borne by the second plane part 23 and the part of the display area (namely, the first plane display area 11), of the flexible display screen 1, borne by the first plane part 21 may be controlled to be used for display. The second plane display area 13 and the first plane display area 11 may display same content, or may display different content. When the second plane display area 13 and the first plane display area 11 are used to display different content, one may display a main control screen, and the other may display a secondary screen. For example, when the foldable display apparatus 100 is used for mutual shooting, the camera is away from the user (referring to a user who operates the foldable display apparatus 100), and the camera faces to-be-shot scene or person. In this case, the flexible display screen 1 displays a shooting control key and a preview image in a display area facing a user side, and the flexible display screen 1 displays only the preview image in a display area away from the user side.

For example, after the one or more processors 101 execute the instruction in response to detection of the third operation:

obtaining recognition information of the recognition component (81/82);

determining, based on the recognition information, whether the recognition component (81/82) faces the user or is away from the user; and when the recognition component (81/82) faces the user, controlling the part of the display area (namely, the second plane display area 13), of the flexible display screen 1, borne by the second plane part 23 to be used for display; and when the recognition component (81/82) is away from the user, controlling the part of the display area (namely, the first plane display area 11), of the flexible display screen 1, borne by the first plane part 21 to be used for display.

The recognition component may be the camera 81. The recognition information is a shot image collected by the camera 81. The shot image is compared with an image prestored in a memory 102, to determine whether the recognition component faces the user or is away from the user. For example, the prestored image is a user facial image (or another recognition image such as a pupil image). When the shot image collected by the camera 81 is the same as the prestored image, it is determined that the recognition component faces the user. When the shot image collected by the camera 81 is different from the prestored image, it is determined that the recognition component is away from the user.

Alternatively, the recognition component may be the sensor 82. When detecting that the distance between the foldable display apparatus 100 and the user is less than or equal to a threshold, the sensor 82 determines that the recognition component faces the user. When detecting that the distance between the foldable display apparatus 100 and the user is greater than a threshold, the sensor 82 determines that the recognition component is away from the user. When the sensor 82 cannot recognize the user, it is also determined that the recognition component is away from the user.

In another embodiment, the recognition component may also be a gravity sensor. When directions of the foldable display apparatus 100 are different, the gravity sensor can perform recognition.

After the one or more processors 101 execute the instruction in response to detection of the third operation:

determining, based on the recognition information of the recognition component, that a display area, of the flexible display screen 1, facing upward is the part of the display area borne by the second plane part 23 (namely, the second plane display area 13) or the part of the display area borne by the first plane part 21 for display (namely, the first plane display area 11); and controlling the display area, of the flexible display screen 1, facing upward to be used for display.

In this application, the foldable display apparatus 100 may collect user position information or position information of the foldable display apparatus 100 through the recognition component (81/82), to determine a relative position relationship between the first plane part 21 and the user and a relative position relationship between the second plane part 23 and the user, and further control the part of the display area (namely, the first plane display area 11 or the second plane display area 13), of the flexible display screen 1, facing the user to be used for display. This improves user experience of the foldable display apparatus 100.

In an implementation, for structures of the flexible display screen 1 and the bearer component 2, refer to FIG. 2 and FIG. 3. The bearer component 2 includes the first plane part 21 and the second plane part 23.

The one or more processors 101 execute the instruction to implement the following steps:

response to detection of a fourth operation, where the fourth operation may be an operation of waking up the flexible display screen 1 by the user; and controlling, based on detection information of the flexible display screen 1, the part of the display area (namely, the second plane display area 13), of the flexible display screen 1, borne by the second plane part 23 or the part of the display area (namely, the first plane display area 11), of the flexible display screen 1, borne by the first plane part 21 to be used for display.

For example, after the one or more processors 101 execute the instruction in response to detection of the fourth operation:

obtaining a first contact area detected by the flexible display screen 1, where the first contact area is a contact area that is of the part of the display area (namely, the first plane display area 11), of the flexible display screen 1, borne by the first plane part 21 and that is touched by the user;

obtaining a second contact area detected by the flexible display screen 1, where the second contact area is a contact area that is of the part of the display area (namely, the second plane display area 13), of the flexible display screen 1, borne by the second plane part 23 and that is touched by the user;

comparing the first contact area with the second contact area; and when the first contact area is less than the second contact area, controlling the part of the display area (namely, the first plane display area 11), of the flexible display screen 1, borne by the first plane part 21 to be used for display; and when the second contact area is less than the first contact area, controlling the part of the display area (namely, the second plane display area 13), of the flexible display screen 1, borne by the second plane part 23 to be used for display.

In this implementation, the foldable display apparatus 100 may determine a holding gesture of the user based on the first contact area and the second contact area, and automatically light up the display area, of the flexible display screen 1, facing the user side, to improve user experience.

In another embodiment, the processor 101 may determine a contact position and an area of a user hand on the flexible display screen 1 based on a signal of the flexible display screen 1, and the processor 101 further analyzes a holding state or a gesture of the user hand, and further determines the area facing the user based on the holding state or the gesture of the user hand.

In an implementation, the one or more processors 101 execute the instruction to further implement the following steps:

when the part of the display area (namely, the first plane display area 11), of the flexible display screen 1, borne by the first plane part 21 is used for display, obtaining a contact position at which the user touches the part of the display area (namely, the first plane display area 11), of the flexible display screen 1, borne by the first plane part 21;

determining that the contact position is located in a left-side area or a right-side area; and when the contact position is located on the left-side area, driving the part of the display area (namely, the first plane display area 11), of the flexible display screen 1, borne by the first plane part 21 to display a left-hand mode screen; and when the contact position is located on the right-side area, driving the part of the display area (namely, the first plane display area 11), of the flexible display screen 1, borne by the first plane part 21 to display a right-hand mode screen.

In this implementation, the foldable display apparatus determines a use habit of the user based on a position at which the lit-up part of the flexible display screen 1 is touched by the user, to switch a screen to the left-hand mode screen or the right-hand mode screen corresponding to the use habit of the user, to improve user experience.

In an implementation, the one or more processors 101 execute the instruction to further implement the following steps:

responding to detecting a fifth operation, where the fifth operation may be that the user selects a display area (for example, the first plane display area 11 or the second plane display area 13) of the flexible display screen 1, and completes a preset action in the display area, for example, a preset touch action such as tap, double tap, or slide; and controlling the display area, of the flexible display screen 1, selected by the user to serve as a home screen for display.

In this implementation, the foldable display apparatus 100 may switch, by sensing a touch action of the user on the flexible display screen 1, the display area selected by the user to the home screen. A switching manner is flexible. This improves user experience of the foldable display apparatus 100.

In an implementation, referring to FIG. 2 to FIG. 5, the foldable display apparatus 100 further includes a camera 81 and a sensor 82. The camera 81 may collect an image. The sensor 82 may detect a distance between the foldable display apparatus 100 and the user. Collection surfaces of the camera 81 and the sensor 82 face the flexible display screen 1. For example, the camera 81 and the sensor 82 are fastened relative to the first plane part 21, a collection surface of the camera 81 faces the first plane display area 11, and a collection surface of the sensor 82 faces the first plane display area 11. Collection surfaces of the camera 81 and the sensor 82 face a part, of the flexible display screen, relatively fastened to the camera 81 and the sensor 82.

The one or more processors 101 execute the instruction to implement the following steps:

responding to detecting a sixth operation, where the sixth operation may be an action that the user starts the camera 82 to shoot;

obtaining a user distance detected by the sensor 82, where the user distance is a distance between the foldable display apparatus 100 and the user;

determining, based on the user distance, whether the camera 82 faces the user or is away from the user; and when the camera 82 faces the user, driving the camera 82 to shoot in a self-shooting mode; and when the camera 82 is away from the user, driving the camera 82 shoot in a mutual shooting mode.

When the user distance is less than or equal to a preset value, it is determined that the camera 82 faces the user. When the user distance is greater that a preset value, it is determined that the camera 82 is away from the user. When the sensor 82 cannot recognize the user, it is also determined that the camera 81 is away from the user.

In this application, because the foldable display apparatus 100 may automatically switch the shooting mode of the camera based on an environment in which the user uses the camera, different image processing algorithms are run in different shooting modes. For example, in the self-shooting mode, beautification may be implemented according to an algorithm, and in the mutual shooting mode long-range blurring and the like may be implemented through an algorithm. In this way, shooting quality of the foldable display apparatus 100 is better, and user experience is improved.

Figure 26:
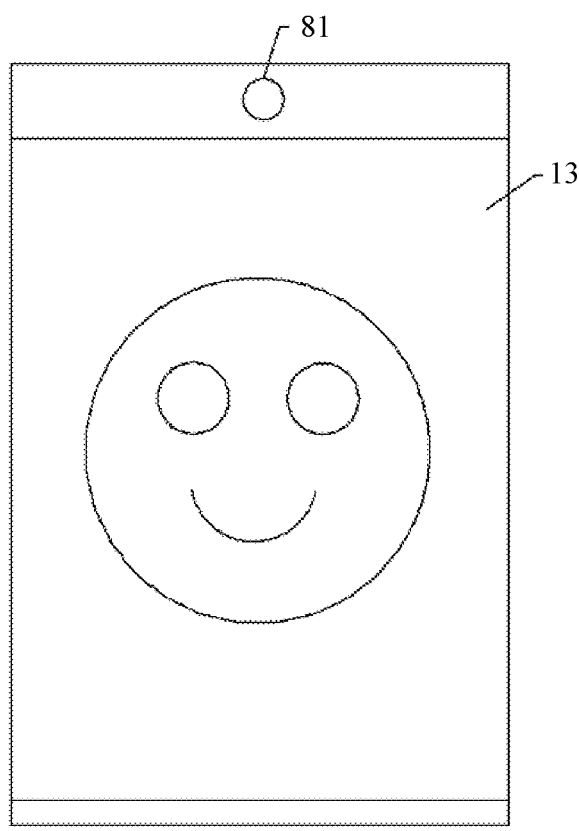
FIG. 26 is a schematic diagram of the foldable display apparatus shown in FIG. 3 in a use state.
Figure 27:
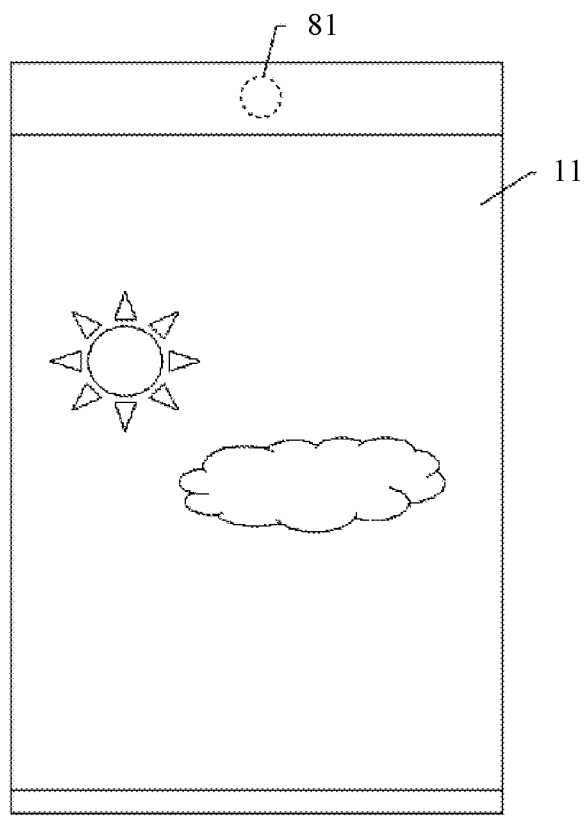
FIG. 27 is a schematic diagram of the foldable display apparatus shown in FIG. 3 in another use state.

Referring to FIG. 26 and FIG. 27 together, in an embodiment, the foldable display apparatus 100 includes a camera 81. A collection surface of the camera 81 is in a same direction as a plane display area (for example, the second plane display area 13) of the flexible display screen 1, and the collection surface of the camera 81 is opposite to another plane display area (for example, the first plane display area 11) of the flexible display screen 1.

As shown in FIG. 26, when the camera 81 faces the user, the camera 81 shoots in a self-shooting mode, and the second plane display area 13 displays a shooting screen. As shown in FIG. 27, when the camera 81 is away from the user, the camera 81 shoots in a mutual shooting mode, and the first plane display area 11 displays a shooting screen. In other words, in the self-shooting mode, the display area, of the flexible display screen 1, facing a same direction as the camera 81 displays a screen. In the mutual shooting mode, the display area, of the flexible display screen 1, opposite to the camera 81 and exposed displays a screen.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A foldable display apparatus, comprising:
   a flexible display screen;
   a bearer component; and
   a camera and a sensor, wherein the camera is configured to capture an image, and the sensor is configured to detect a distance between the foldable display apparatus and a user thereof;
   wherein the bearer component comprises a first plane part, a first bending part, a second plane part, a second bending part, and a third plane part that are sequentially connected in a long side direction;
   wherein a length of the first bending part in the long side direction is greater than a length of the second bending part in the long side direction;
   wherein the first plane part, the first bending part, the second plane part, the second bending part, and the third plane part jointly bear the flexible display screen;
   wherein the third plane part is folded between the first plane part and the second plane part through bending and deformation of the first bending part and the second bending part;
   wherein parts of the flexible display screen borne by the first plane part and the second plane part are exposed;
   wherein the foldable display apparatus further comprises a first housing that is fastened to a side of the first plane part or the second plane part and away from the flexible display screen, and
   wherein both the camera and the sensor are disposed in the first housing, and correspond to either a first plane display area overlapping the first plane part or a second plane display area overlapping the second plane part, wherein the camera is configured to automatically switch between a front-facing shooting mode and a rear-facing shooting mode based on the distance detected by the sensor between the foldable display apparatus and the user.

2. The foldable display apparatus according to claim 1, wherein the foldable display apparatus further comprises a second housing, and a thickness of the first housing is different from a thickness of the second housing, the first housing is fastened to a side, of the first plane part, away from the flexible display screen, and the second housing is fastened to a side, of the second plane part, away from the flexible display screen.

3. The foldable display apparatus according to claim 1, wherein the foldable display apparatus further comprises a second housing, and a thickness of the first housing is different from a thickness of the second housing, the first housing is fastened to a side, of the second plane part, away from the flexible display screen, and the second housing is fastened to a side, of the third plane part, away from the flexible display screen.

4. The foldable display apparatus according to claim 1, wherein the bearer component is an integrated bearing plate that comprises a shape-memory metal material.

5. The foldable display apparatus according to claim 1, wherein the first plane part, the second plane part, the third plane part are rigid plates, and the first bending part and the second bending part are shape-memory plates, and each of the shape-memory plates comprises a shape-memory metal material.

6. The foldable display apparatus according to claim 1, wherein the first plane part, the second plane part, and the third plane part are rigid plates, the first bending part and the second bending part comprise a deformable plate and a bending piece, the deformable plate and the bending piece are disposed in a stacked manner, the deformable plate comprises a shape-memory metal material, and the bending piece is bent or unfolded under external force.

7. The foldable display apparatus according to claim 6, wherein the bending piece has a structure of an elastic plate structure, a chain structure, a meshing gear group structure, or a rotating shaft connection structure.

8. The foldable display apparatus according to claim 1, wherein the foldable display apparatus further comprises a first position-limiting component and a second position-limiting component, two parts of the first position-limiting component are respectively fastened to the first plane part and the second plane part, two parts of the second position-limiting component are respectively fastened to the second plane part and the third plane part, when the bearer component is folded, the two parts of the first position-limiting component cooperate with each other to fasten the first plane part and the second plane part, and the two parts of the second position-limiting component cooperate with each other to fasten the second plane part and the third plane part.

9. The foldable display apparatus according to claim 8, wherein the first position-limiting component comprises two mutually adsorbed adsorption components, or comprises two fasteners that can be fastened to each other.

10. The foldable display apparatus according to claim 1, wherein the bearer component further comprises a first arc surface part and a second arc surface part, the first arc surface part is connected to a side, of the first plane part, away from the first bending part, the second arc surface part is connected to a side, of the third plane part, away from the second bending part, and the first arc surface part and the second arc surface part are also used to bear the flexible display screen.

11. The foldable display apparatus according to claim 1, wherein the flexible display screen comprises a first bending display area, a second bending display area, and a third plane display area, the first bending display area overlaps the first bending part, the second bending display area overlaps the second bending part, and the third plane display area overlaps the third plane part.

12. The foldable display apparatus according to claim 1, wherein the flexible display screen is a touch display screen.

13. The foldable display apparatus according to claim 1, wherein the flexible display screen is an organic light emitting diode display screen.

14. The foldable display apparatus according to claim 1, wherein the foldable display apparatus is a mobile phone, a wearable device, or a tablet computer.

15. The foldable display apparatus according to claim 1, wherein a plurality of components of the foldable display apparatus are arranged in the first housing.

16. The foldable display apparatus according to claim 1, wherein the foldable display apparatus further comprises a second housing, wherein the first housing is fastened to a side of the second plane part, and the second housing is fastened to a side of first plane part, and wherein a thickness of the first housing is different from a thickness of the second housing.

17. The foldable display apparatus according to claim 16, wherein a plurality of components of the foldable display apparatus are arranged in the first housing and a plurality of other components of the foldable display apparatus the second housing.

18. The foldable display apparatus according to claim 1, wherein no housing is fastened to a side of the first plane part or the third plane part.

19. A foldable display apparatus, comprising:
a flexible display screen;
a bearer component; and
a camera and a sensor, wherein the camera is configured to capture an image, and the sensor is configured to detect a distance between the foldable display apparatus and a user thereof;
wherein the bearer component comprises a first plane part, a first bending part, a second plane part, a second bending part, and a third plane part that are sequentially connected in a long side direction;
wherein a length of the first bending part in the long side direction is greater than a length of the second bending part in the long side direction;
wherein the first plane part, the first bending part, the second plane part, the second bending part, and the third plane part jointly bear the flexible display screen;
wherein the third plane part is folded between the first plane part and the second plane part through bending and deformation of the first bending part and the second bending part;
wherein parts of the flexible display screen borne by the first plane part and the second plane part are exposed;
wherein the foldable display apparatus further comprises a first housing that is fastened to a side of the first plane part or the second plane part and away from the flexible display screen;
wherein both the camera and the sensor are disposed in the first housing, and correspond to either a first plane display area overlapping the first plane part or a second plane display area overlapping the second plane part, wherein the camera is configured to automatically switch between a front-facing shooting mode and a rear-facing shooting mode based on the distance detected by the sensor between the foldable display apparatus and the user;
and further comprising one or more processors, one or more memories, and an instruction that is stored in the one or more memories and that can be executed by the one or more processors, wherein the one or more processors executes the instruction to implement the following steps:
responding to detection of a first operation; and
driving the bearer component to change to a folded state, wherein the third plane part is folded between the first plane part and the second plane part, and parts of the flexible display screen, borne by the first plane part and the second plane part are exposed.

20. The foldable display apparatus according to claim 19, wherein the foldable display apparatus further comprises a recognition component, and the one or more processors execute the instruction to further implement the following steps:
responding to detection of a third operation; and
controlling, based on recognition information of the recognition component, a part of a display area, of the flexible display screen, borne by the second plane part and/or a part of a display area, of the flexible display screen, borne by the first plane part to be used for display.

* * * * *